(12) United States Patent
Maeda et al.

(10) Patent No.: US 7,647,887 B2
(45) Date of Patent: Jan. 19, 2010

(54) THIN FILM FORMING APPARATUS

(75) Inventors: Kikuo Maeda, Hino (JP); Yoshiro Toda, Hino (JP); Koji Fukazawa, Hino (JP)

(73) Assignee: Konica Minolta Holdings, Inc. (JP)

( * ) Notice: Subject to any disclaimer, the term of this patent is extended or adjusted under 35 U.S.C. 154(b) by 836 days.

(21) Appl. No.: 10/807,774

(22) Filed: Mar. 23, 2004

(65) Prior Publication Data
US 2004/0187783 A1 Sep. 30, 2004

(30) Foreign Application Priority Data

Mar. 31, 2003 (JP) ............................ 2003-095367
Jul. 11, 2003 (JP) ............................ 2003-195845
Jul. 24, 2003 (JP) ............................ 2003-201172

(51) Int. Cl.
*C23C 16/00* (2006.01)
(52) U.S. Cl. ................................. 118/723 E; 118/718
(58) Field of Classification Search ............. 118/723 E, 118/718
See application file for complete search history.

(56) References Cited

U.S. PATENT DOCUMENTS

| 5,652,022 | A  | * | 7/1997  | Achtner et al. | ............... | 427/251 |
| 6,106,659 | A  |   | 8/2000  | Spence et al.  |                |         |
| 6,489,585 | B1 | * | 12/2002 | Nakamura et al.| ......          | 219/121.52 |
| 6,759,100 | B2 | * | 7/2004  | Fukuda et al.  | ............... | 427/569 |
| 7,166,335 | B2 | * | 1/2007  | Fukuda et al.  | ............... | 427/562 |

FOREIGN PATENT DOCUMENTS

| JP | 56005975  | A | * | 1/1981  |
| JP | 59-219927 |   |   | 12/1984 |
| JP | 62037376  | A | * | 2/1987  |
| JP | 63134677  | A | * | 6/1988  |
| JP | 63136525  | A | * | 6/1988  |

(Continued)

OTHER PUBLICATIONS

European Search Report for Application No. 04713655.1; Patent No. PCT/JP2004002082; Dated Aug. 1, 2008; with English translation.

(Continued)

*Primary Examiner*—Parviz Hassanzadeh
*Assistant Examiner*—Michelle Crowell
(74) *Attorney, Agent, or Firm*—Cantor Colburn LLP

(57) ABSTRACT

A thin film forming apparatus includes: a first electrode having a first discharge surface and a second electrode having a second discharge surface, the first discharge surface facing opposite to the second discharge surface to form a discharge space; a gas supply unit for supplying a gas including a thin film formation gas to the discharge space; a power source for discharging and activating the gas by applying a high frequency electric field across the discharge space; and a film transporting mechanism for transporting a protecting film for preventing at least one of the first electrode and the second electrode from being exposed to the activated gas, wherein a thin film is formed by exposing a substrate to the activated gas and, the protecting film is transported in contact with at least one of the first discharge surface and the second discharge surface and with at least a part of a surface other than the discharge surface which continues to the discharge surface.

17 Claims, 13 Drawing Sheets

FOREIGN PATENT DOCUMENTS

| | | | |
|---|---|---|---|
| JP | 9-289170 A | 11/1997 | |
| JP | 11-291385 A | 10/1999 | |
| JP | 2000-212753 | 8/2000 | |
| JP | 2000-306905 A | 11/2000 | |
| JP | 2002-339075 A | 11/2002 | |
| JP | 2002339075 A | * 11/2002 | |
| JP | 2003-49272 A | 2/2003 | |
| JP | 2003-49273 | 2/2003 | |
| JP | 2003-049273 A | 2/2003 | |
| JP | 2003-129246 A | 5/2003 | |
| JP | 2003229299 A | * 8/2003 | |

OTHER PUBLICATIONS

Japanese Office Action for Japanese Patent Application No. 2003-201172 mailed Mar. 24, 2009 with English Translation.

Japanese Office Action for Japanese Patent Application No. 2003-195845 mailed Mar. 24, 2009 with English Translation.

* cited by examiner

THIN FILM FORMING APPARATUS

BACKGROUND OF THE INVENTION

1. Field of the Invention

The present invention generally relates to a thin film forming apparatus and a thin film forming method, and more particularly to a thin film forming apparatus and a thin film forming method for forming a thin film on a substrate by the use of atmospheric pressure CVD (chemical vapor deposition)

2. Description of Related Art

Conventionally, a material produced by forming a high-performance thin film on a substrate has been used for various products such as a large scale integrated circuit (LSI), a semiconductor, a display device, a magnetic recording device, a photoelectric conversion device, a solar cell, a Josephson device and a photothermal conversion device. As a method for forming a thin film on a substrate, the following methods can be cited: a wet type film formation method typified by coating; a sputtering method; a vacuum pressure evaporation method; a dry type film formation method typified by a ion plating method; an atmospheric pressure plasma CVD using atmospheric pressure plasma discharge processing; and the like. Recently, the atmospheric pressure plasma CVD which can form a high quality thin film while maintaining a high productivity has been especially desired.

In the atmospheric pressure plasma film formation method, thin film formation gas is supplied to a substrate disposed between opposed electrodes, and an electric field is applied between both of the electrodes. Thereby, discharge plasma is generated, and the substrate is exposed to the discharge plasma. Thereby, a thin film is formed on the substrate. When discharge surfaces of the electrodes are contaminated owing to the generation of the discharge plasma, the thin film cannot be formed to be uniform. As a thin film forming apparatus which can prevent the contamination and can perform efficient thin film formation, for example, a thin film forming apparatus disclosed in JP-Tokukai-2000-212753A can be cited. The thin film forming apparatus includes two opposed electrodes, a high voltage pulsed power supply for applying a pulsed electric field between those electrodes, a film transporting mechanism for transporting a substrate to each discharge surface of the two electrodes with the substrate contacting each discharge surface, and thin film formation gas supply unit for supplying thin film formation gas between the electrodes. After the thin film forming apparatus has supplied the thin film formation gas between the electrodes, the thin film forming apparatus applies the pulsed electric field to the electrodes to generate discharge plasma. Thereby, the thin film forming apparatus forms thin films on the substrates severally contacting the two electrodes. That is, because the discharge surfaces of the two electrodes are always covered by the substrates during the discharge plasma is generated, the contamination of the discharge surfaces can be prevented.

However, a result of research by the inventers of the present invention shows the following problem. That is, even if only the discharge surfaces of the electrodes are covered by the substrates, as shown in FIG. 13, a plasma space h in which discharge plasma is generated projects from the discharge surfaces 101a and 102a of the electrodes 101 and 102. Consequently, substrates 103 and 104 enters the plasma space h before they are contacted with the discharge surfaces 101a and 102a, or in a state of being unsupported, and the substrates 103 and 104 are influenced by the heat of the discharge plasma excessively and rapidly. Thereby, the substrates 103 and 104 contract to produce wrinkles and stretches thereon, and consequently not uniform films are formed.

SUMMARY OF THE INVENTION

It is an object of the present invention to provide a thin film forming apparatus and a thin film forming method, both capable of forming a high quality thin film.

In order to accomplish the above-mentioned object, according to a first aspect of the present invention, a thin film forming apparatus comprises:

a first electrode having a first discharge surface and a second electrode having a second discharge surface, the first discharge surface facing opposite to the second discharge surface to form a discharge space;

a gas supply unit for supplying a gas including a thin film formation gas to the discharge space;

a power source for discharging and activating the gas by applying a high frequency electric field across the discharge space; and a film transporting mechanism for transporting a protecting film for preventing at least one of the first electrode and the second electrode from being exposed to the activated gas, wherein a thin film is formed by exposing a substrate to the activated gas and, the protecting film is transported in contact with at least one of the first discharge surface and the second discharge surface and with at least a part of a surface other than the discharge surface which continues to the discharge surface.

Furthermore, according to a second aspect of the present invention, a thin film forming method comprises:

supplying gas comprising thin film formation gas from a gas supply unit to a discharge space which is formed by a first electrode and a second electrode of which discharge surfaces face each other;

activating the gas by generating a high frequency electric field in the discharge space;

forming a thin film on a substrate by exposing the substrate to the activated gas; and transporting a protecting film for preventing at least one of the first electrode and the second electrode from being exposed to the activated gas, in contact with at least one of the discharge surfaces of the first electrode and the second electrode, and with at least a part of a surface other than the discharge surface, which continues to the discharge surface.

According to the thin film forming apparatus of the first aspect of the present invention and the thin film forming method of the second aspect of the present invention, the protecting film is transported in contact with at least one of the fist electrode and the second electrode, and with the surface other than the discharge surface, which continues to the discharge surface. Therefore, at least one of the first electrode and the second electrode is not exposed to the activated gas, and then, the first electrode and the second electrode can be prevented from contamination.

Furthermore, because the protecting film is transported by the film transporting mechanism, the protecting film contacting at least one of the discharge surfaces of the first electrode and the second electrode can be exchanged for a new one continuously.

Hereupon, when wrinkles and stretches are produced on the protecting film positioned at the discharge surface of the second electrode, uniformity in a plasma space is disturbed, and un-uniform film formation is performed. A cause of the generation of the wrinkles and the stretches is, similarly to the case of the above-mentioned substrate, that the protecting film enters the plasma space, where discharge plasma is generated, in a state of being unsupported to contract by being thermally influenced. However, because the protecting film contacts the discharge surface of the second electrode and to the surface other than the discharge surface, which continues to the discharge surface, the protecting film enters the plasma space, being supported by the surface other than the discharge surface. Thereby, even if the protecting film is thermally influenced, the influence is averaged. Consequently, the generation of wrinkles and stretches can be prevented. Hence, the uniformity in the plasma space can be maintained, and a high quality thin film can be formed.

Then, because the protecting film contacts at least one of the discharge surfaces of the first electrode and the second electrode, at least one of the discharge surfaces of the first electrode and the second electrode can be protected in the case where only the discharge gas is made to flow in the discharge space without making the film formation gas flow.

As described above, because the protecting film prevents the discharge surface of the second electrode from being contaminated and protects the discharge surface, thin films can be stably formed over a long period of time.

For example, of the couple of electrodes facing each other, the electrode contacting the substrate on which the film is formed is defined as the first electrode, and the electrode facing the first electrode is defined as the second electrode. Then, according to the apparatus of the first aspect of the present invention, preferably, the film transporting mechanism transports the protecting film, in contact with the discharge surface of the second electrode and with at least a part of the surface other than the discharge surface, which continues to the discharge surface.

According to the thin film forming apparatus of the second aspect of the present invention, preferably, the protecting film is transported in contact with the discharge surface of the second electrode and with at least a part of the surface other than the discharge surface, which continues to the discharge surface.

According to the present invention, because the protecting film contacts the second electrode, the second electrode can be certainly prevented from being contaminated by the activated gas. When the discharge surface of the second electrode has no contamination, a high quality film without any contamination can be formed.

According to the apparatus of the first aspect of the present invention, preferably, the first electrode and the second electrode generate the high frequency electric field in the discharge space under an atmospheric pressure or a pressure near to the atmospheric pressure.

According to the method of the second aspect of the present invention, preferably, the high frequency electric field in the discharge space is generated by the first electrode and the second electrode under an atmospheric pressure or a pressure near to the atmospheric pressure.

According to the present invention, because the film formation can be performed under the atmospheric pressure or the pressure near to the atmospheric pressure, high speed film formation can be performed and continuous manufacturing can be performed in comparison with the film formation performed under a vacuum pressure. Then, because no equipment for making the vacuum pressure is required, the cost of equipment can be reduced.

According to the apparatus of the first aspect of the present invention, preferably, a heating equipment for heating the protecting film is provided on an upper stream side in a transportation direction of the protecting film with respect to the discharge surface of the second electrode.

According to the method of the second aspect of the present invention, preferably, the protecting film is heated on an upper stream side in a transportation direction of the protecting film with respect to the discharge surface of the second electrode.

According to the present invention, because the protecting film is heated on the upper stream side with respect to the discharge surface of the second electrode, the protecting film can be heated before being contacted with the discharge surface of the second electrode. Consequently, even when the protecting film enters the plasma space, the protecting film can be prevented from being influenced thermally in a rapid and excessive manner, and the thermal constriction of the protecting film owing to the heat of the discharge plasma can be prevented. Hence, the generation of wrinkles and stretches on the protecting film can be further prevented.

According to the apparatus of the first aspect of the present invention, preferably, the heating equipment heats the protecting film stepwise or continuously until the protecting film reaches the discharge surface.

According to the method of the second aspect of the present invention, preferably, the protecting film is heated stepwise or continuously until the protecting film reaches the discharge surface.

According to the present invention, because the protecting film is heated stepwise or continuously until the protecting film reaches the discharge surface, the protecting film is not rapidly heated at the heating equipment, and thereby the generation of wrinkles and stretches can be further suppressed.

According to the apparatus of the first aspect of the present invention, preferably, the thin film forming apparatus further comprises a substrate transporting mechanism for transporting the substrate in contact with the discharge surface of the first electrode.

According to the method of the second aspect of the present invention, preferably, the substrate is transported in contact with the discharge surface of the first electrode.

According to the present invention, the substrate is transported in contact with the discharge surface of the first electrode, the discharge surface of the first electrode can be prevented from being contaminated by the activated gas.

According to the apparatus of the first aspect of the present invention, preferably, the substrate transporting mechanism transports the substrate in a state in which the substrate contacts the discharge surface of the first electrode, after the substrate transporting mechanism makes the substrate contact the surface other than the discharge surface, which continues to the discharge surface of the first electrode.

According to the method of the second aspect of the present invention, preferably, the substrate is transported in a state in which the substrate contacts the discharge surface of the first electrode, after the substrate is contacted with the surface other than the discharge surface, which continues to the discharge surface of the first electrode.

According to the present invention, before the substrate contacts the discharge surface of the first electrode, the substrate contacts the surface other than the discharge surface, which continues to the discharge surface of the first electrode. Consequently, the substrate enters the plasma space in the state of being supported by the surface other than the discharge surface. Thereby, even when the substrate is thermally influenced, the influence is averaged. Hence, the generation of wrinkles and stretches can be prevented, and a high quality thin film can be formed.

According to the apparatus of the first aspect of the present invention, preferably, a continuous corner part between the discharge surface of the second electrode and the surface other than the discharge surface is shaped in an arc.

According to the method of the second aspect of the present invention, preferably, a continuous corner part between the discharge surface of the second electrode and the surface other than the discharge surface is shaped in an arc.

According to the present invention, because the continuous corner part between the discharge surface of the second electrode and the surface other than the discharge surface, which continues to the discharge surface, is shaped in the arc, the protecting film can be prevented from being hitched during moving from the surface other than the discharge surface to the discharge surface, and the protecting film can be transported smoothly.

According to the apparatus of the first aspect of the present invention, preferably, the discharge surface of the second electrode is formed to be a curved surface convex toward the discharge surface of the first electrode.

According to the method of the second aspect of the present invention, preferably, the discharge surface of the second electrode is formed to be a curved surface convex toward the discharge surface of the first electrode.

According to the present invention, because the discharge surface of the second electrode is formed to be the curved surface convex toward the discharge surface of the first electrode, the contact between the discharge surface of the second electrode and the protecting film can be heightened.

According to the apparatus of the first aspect of the present invention, preferably, the second electrode is formed of a plurality of small electrodes; and the film transporting mechanism is provided to each of the small electrodes.

According to the method of the second aspect of the present invention, preferably, the second electrode is formed of a plurality of small electrodes; and the protecting film is transported at each of the small electrodes.

According to the present invention, because the protecting film is transported at each of the small electrodes, the contamination of each of the small electrodes can be prevented.

According to the apparatus of the first aspect of the present invention, preferably, the small electrodes are fixed; and the film transporting mechanisms transport the protecting films while rubbing the protecting films against the surfaces of the small electrodes.

According to the method of the second aspect of the present invention, preferably, the small electrodes are fixed; and the protecting films are transported while rubbing the protecting films against the surfaces of the small electrodes.

According to the present, even if the small electrodes are fixed, the protecting films are transported while rubbing the protecting films against the surfaces of the small electrodes. Consequently, the generation of wrinkles and stretches can be suppressed to the utmost.

According to the apparatus of the first aspect of the present invention, preferably, the small electrodes are roller electrodes; and the roller electrodes rotate according to the transportation of the protecting films by the film transporting mechanisms.

According to the method of the second aspect of the present invention, preferably, the small electrodes are roller electrodes; and the roller electrodes rotate according to the transportation of the protecting films.

According to the present invention, because the small electrodes are roller electrodes and rotate according to the transportation of the protecting films, the protecting films can be transported smoothly.

According to the apparatus of the first aspect of the present invention, preferably, the first electrode is a roller electrode; and the plurality of the small electrodes is rod electrodes disposed to be opposed to the peripheral surface of the roller electrode.

According to the method of the second aspect of the present invention, preferably, the first electrode is a roller electrode; and the plurality of the small electrodes is rod electrodes disposed to be opposed to the peripheral surface of the roller electrode.

According to the present invention, also in the case where the first electrode is made to be the roller electrode and the plurality of the small electrodes are disposed to be opposed to the peripheral surface of the roller electrode, the contamination of the first electrode and the second electrode can be prevented.

According to the apparatus of the first aspect of the present invention, preferably, the gas supply unit is disposed so as to supply the gas to the discharge space through a flow path formed as an interval between a first small electrode among the plurality of the small electrodes and a second small electrode adjoining to the first small electrode; and the film transporting mechanisms of each of the first small electrode and the second small electrode transports the protecting films, in contact with a surface of one of the small electrodes forming the flow path.

According to the method of the second aspect of the present invention, preferably, the gas supply unit is disposed so as to supply the gas to the discharge space through a flow path formed as an interval between a first small electrode among the plurality of the small electrodes and a second small electrode adjoining to the first small electrode; and the protecting films are transported so as to contact a surface of the small electrodes forming the flow path, with respect to each of the fist electrode and the second electrode.

According to the present invention, because the protecting films contact the surfaces of the small electrodes forming the flow path of the gas, the contamination of the surfaces of the small electrodes forming the flow path can be prevented.

According to the apparatus of the first aspect of the present invention, preferably, each of the surfaces of the small electrodes forming the flow path is formed to be a curved surface convex toward a center of the flow path.

According to the method of the second aspect of the present invention, preferably, each of the surfaces of the small electrodes forming the flow path is formed to be a curved surface convex toward a center of the flow path.

According the present invention, because each of the surfaces of the small electrodes forming the flow path is formed to be the curved surface convex toward the center of the flow path, the protecting films can be smoothly transported even in the flow path in contact with the small electrodes, and the generation of wrinkles and stretches can be suppressed.

According to the apparatus of the first aspect of the present invention, preferably, the film transporting mechanism of each of the first small electrode and the second small electrode transports the protecting film to the surface of the small electrode forming the flow path, after the film transporting mechanism contacts the protecting film with at least a part of the gas supply unit.

According to the method of the second aspect of the present invention, preferably, the protecting film is transported to the surface of the small electrode forming the flow path, after the protecting film is contacted with at least a part of the gas supply unit, with respect to each of the first small electrode and the second small electrode.

According to the present invention, because the protecting film is contacted with the circumference of the gas supply unit before being transported to one of the surfaces of the small electrodes forming the flow path, the space from the gas supply unit to the flow path is partitioned by the protecting film, and consequently the gas is prevented from flowing to the outside of the flow path.

According to the apparatus of the first aspect of the present invention, preferably, the high frequency electric field is formed by superposing a first high frequency electric field by the first electrode and the second high frequency electric field by the second electrode;

a frequency $\omega 2$ of the second high frequency electric field is higher than a frequency $\omega 1$ of the first high frequency electric field; and a relation among an electric field intensity $V1$ of the first high frequency electric field, an electric field intensity $V2$ of the second high frequency electric field and a discharge start electric field intensity $IV$ satisfies an inequality $V1 \geq IV > V2$ or an inequality $V1 > IV \geq V2$.

According to the method of the second aspect of the present invention, preferably, the high frequency electric field is formed by superposing a first high frequency electric field by the first electrode and the second high frequency electric field by the second electrode;

a frequency $\omega 2$ of the second high frequency electric field is higher than a frequency $\omega 1$ of the first high frequency electric field; and a relation among an electric field intensity $V1$ of the first high frequency electric field, an electric field intensity $V2$ of the second high frequency electric field and a discharge start electric field intensity $IV$ satisfies an inequality $V1 \geq IV > V2$ or an inequality $V1 > IV \geq V2$.

According to the present invention, the high frequency electric field is formed by superposing a first high frequency electric field and the second high frequency electric field, and the frequency $\omega 2$ of the second high frequency electric field is higher than the frequency $\omega 1$ of the first high frequency electric field, and further the relation among the electric field intensity $V1$ of the first high frequency electric field, the electric field intensity $V2$ of the second high frequency electric field and the discharge start electric field intensity $IV$ meets the inequality $V1 \geq IV > V2$ or the inequality $V1 > IV \geq V2$. Consequently, even when an inexpensive gas such as nitrogen is used, discharges capable of forming a thin film are generated, and high density plasma necessary for high quality thin film formation can be generated.

According to the apparatus of the first aspect of the present invention, preferably, the protecting film is made from polyester.

According to the method of the second aspect of the present invention, preferably, the protecting film is made from polyester.

Hereupon, the polyester is superior in productivity and more inexpensive in comparison with the other resins. Consequently, according to the present invention, when the protecting film is made from the polyester like this embodiment, the productivity can be heightened.

According to the apparatus of the first aspect of the present invention, preferably, a width of the protecting film is set to be wider than the discharge space.

According to the method of the second aspect of the present invention, preferably, a width of the protecting film is set to be wider than the discharge space.

According to the present invention, because the width of the protecting film is set to be wider than the discharge space, the second electrode is covered by the protecting film. Thereby, the second electrode is not exposed to the discharge plasma, and then the contamination of the second electrode can be prevented. Moreover, because the edges of the protecting film do not enter the discharge space, arc discharges owing to the concentration of discharges can be prevented.

According to the apparatus of the first aspect of the present invention, preferably, in the gas supply unit, a plurality of jet ports for jetting the gas to the discharge space are arranged along an axial direction of the small electrode;

a jet condition is capable of being set with respect to each of the plurality of jet ports;

the jet condition with respect to at least one or more jet ports provided at both ends among the plurality jet ports is set so as to jet gas without thin film formation gas including no material for thin film formation; and the jet condition with respect to the jet port other than at least one or more jet ports provided at both ends is set so as to jet source gas including thin film formation gas.

According to the method of the second aspect of the present invention, preferably, in the gas supply unit, a plurality of jet ports for jetting the gas to the discharge space are arranged along an axial direction of the small electrode;

a jet condition is capable of being set with respect to each of the plurality of jet ports;

the jet condition with respect to at least one or more jet ports provided at both ends among the plurality jet ports is set so as to jet gas without thin film formation gas including no material for thin film formation; and the jet condition with respect to the jet port other than at least one or more jet ports provided at both ends is set so as to jet source gas including thin film formation gas.

According to the present invention, because the jet conditions can be set with respect to the plurality of jet ports respectively, each of the jet conditions can be set so as to make the gas including materials for the thin film formation be hard to flow out from the flow path or the discharge space A. Herewith, the gas can be prevented from flowing out, and the contamination of the inside of the apparatus can be suppressed. Moreover, the jet conditions of at least one of the jet ports which are placed on both the end portions of the gas supply unit are set so as to jet the gas without thin film formation gas not including materials for the thin film formation. Hence, the source gas flowing out from the jet port other than these jet ports is blocked by the gas without thin film formation gas, and consequently, it can be prevented that the materials for the thin film formation, which is also the cause of contamination, flow out.

According to the apparatus of the first aspect of the present invention, preferably, in the gas supply unit, the plurality of jet ports for jetting gas to the discharge space are arranged along an axial direction of the small electrode, the thin film forming apparatus further comprising a gas suction unit for sucking the gas flowing out from the flow path, the gas suction unit being placed on at least one of sides of the small electrodes.

According to the method of the second aspect of the present invention, preferably, in the gas supply unit, the plurality of jet ports for jetting gas to the discharge space are arranged along an axial direction of the small electrode, the gas flowing out from the flow path is sucked by a gas suction unit placed on at least one of sides of the small electrodes.

According to the present invention, because the gas suction unit is provided on at least one of sides of the small electrodes, the gas flowing out from the side of the small electrode can be sucked by the gas suction unit. Hence, the contamination of the inside of the apparatus can be suppressed.

According to the apparatus of the first aspect of the present invention, preferably, the suction conditions during the suction of the gas are set with respect to each of at least one of the gas suction units.

According to the method of the second aspect of the present invention, preferably, the suction conditions during the suction of the gas are set with respect to each of at least one of the gas suction units.

According to the present invention, because the suction conditions are set with respect to each of at least one of the gas suction units, each of the suction conditions can be set so as to suck the flowing gas more effectively. Hence, the contamination of the inside of the apparatus can be suppressed.

According to the apparatus of the first aspect of the present invention, preferably, at both end portions of the flow path, filling materials contacting the first small electrode and the second small electrode are provided so as to fill the flow path.

According to the method of the second aspect of the present invention, preferably, at both end portions of the flow path, filling materials contacting the first small electrode and the second small electrode are provided so as to fill the flow path.

According to the present invention, because the filling materials are provided at both the end portions of the flow path formed by the fist electrode and the second electrode, the gas is blocked by the filling materials. Hence, the gas can be prevented from flowing out form the gap between the electrodes.

BRIEF DESCRIPTION OF THE DRAWINGS

The present invention will become more fully understood from the detailed description given hereinafter and the accompanying drawing given by way of illustration only. However thus are not intended as a definition of the limits of the present invention. Wherein.

PREFERRED EMBODIMENTS OF THE INVENTION

Figure 1:
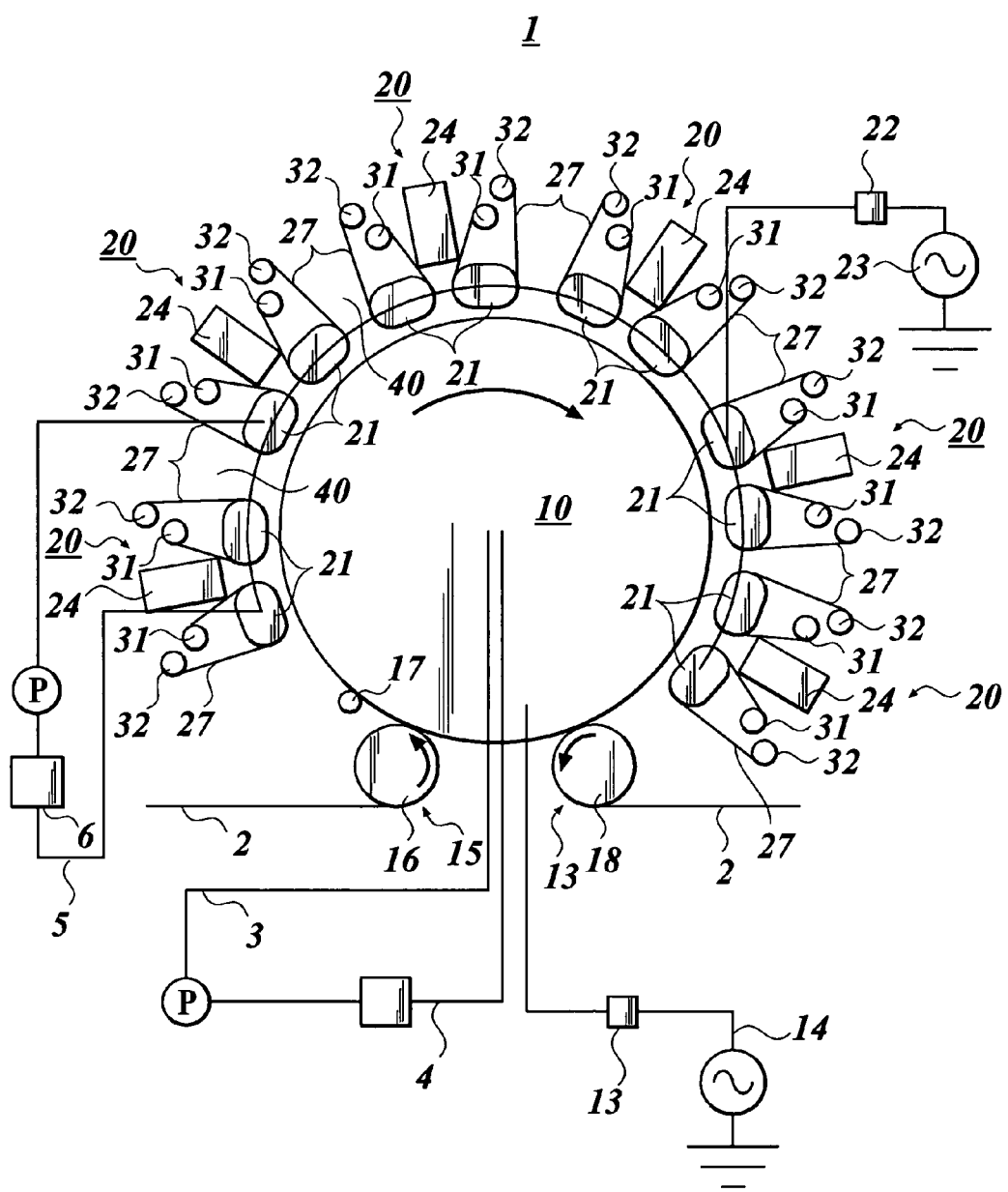
FIG. 1 is a side view showing outline of configuration of a thin film forming apparatus of the present invention.

In the following, the attached drawings are referred to while the preferred embodiments of the present invention are described. FIG. 1 is a side view showing a schematic configuration of a thin film forming apparatus 1.

The thin film forming apparatus 1 is a thin film forming apparatus for forming a thin film on a substrate by generating discharge plasma under a pressure of the atmospheric pressure or a pressure near to the atmospheric pressure to activate gas, and by exposing the substrate to the activated gas. The thin film forming apparatus 1 is, as shown in FIG. 1, provided with a freely rotatable first electrode 10 transporting a sheeted substrate 2 with the substrate 2 contacting onto the peripheral surface of the first electrode 10.

Figure 2:
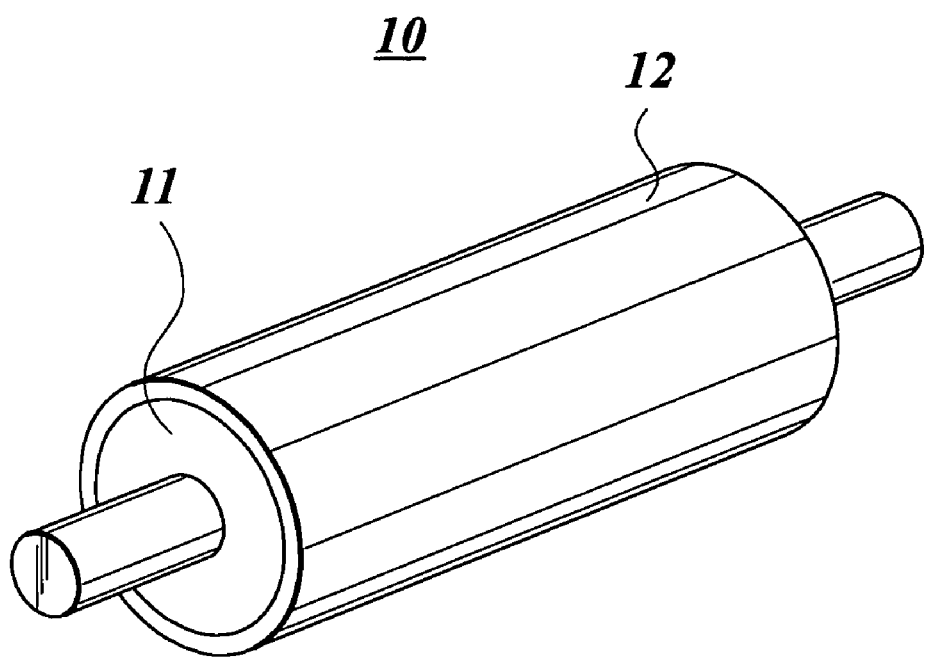
FIG. 2 is a perspective view showing a first electrode provided in the thin film forming apparatus of FIG. 1.

FIG. 2 is a perspective view showing the first electrode 10. The first electrode 10 is a roller electrode made by coating a dielectric 12 on the surface of a electrically-conductive metallic base material 11. The first electrode 10 is formed so that a temperature adjusting medium such as water or a silicone oil can circulate inside the first electrode 10 for adjusting the surface temperature thereof. A temperature control unit 4 is connected to the circulation portion through a pipe arrangement 3, as shown in FIG. 1. Moreover, a first power source 14 is connected to the first electrode 10 through a first filter 13. On the circumference of the first electrode 10, a substrate transporting mechanism 15 for transporting the substrate 2, with the substrate 2 contacting the peripheral surface of the first electrode 10, and a plurality of thin film forming units 20 for forming a thin film on the substrate 2 are provided.

The substrate transporting mechanism 15 includes a first guide roller 16 and a first nip roller 17 for guiding the substrate 2 to the peripheral surface of the first electrode 10, a second guide roller 18 for peeling the substrate 2 contacting the peripheral surface therefrom to guide to the next process, and a drive source 51 (see FIG. 6) for rotating the first guide roller 16, the second guide roller 18 and the first electrode 10 so as to interlock with one another.

Figure 3:
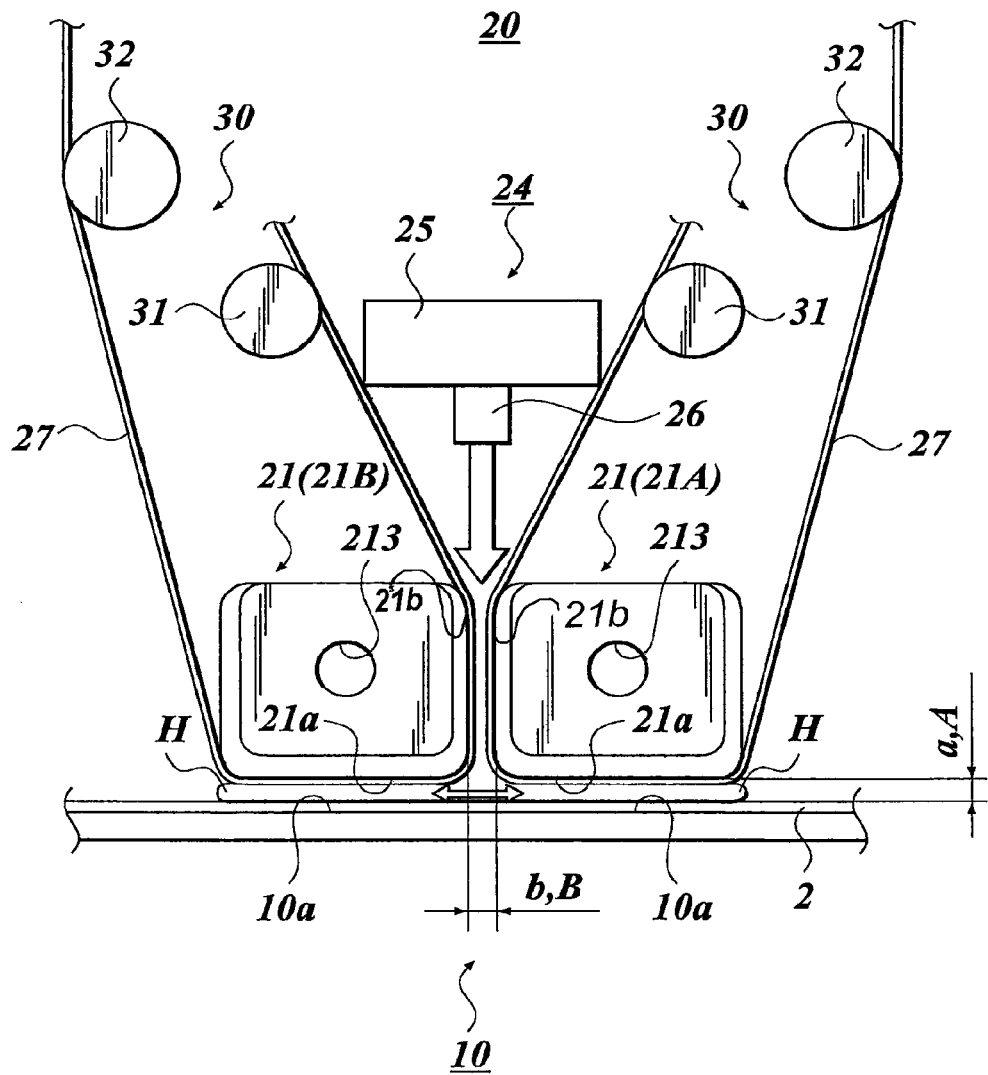
FIG. 3 is a side view showing a thin film forming unit provided in the thin film forming apparatus of FIG. 1.
Figure 4:
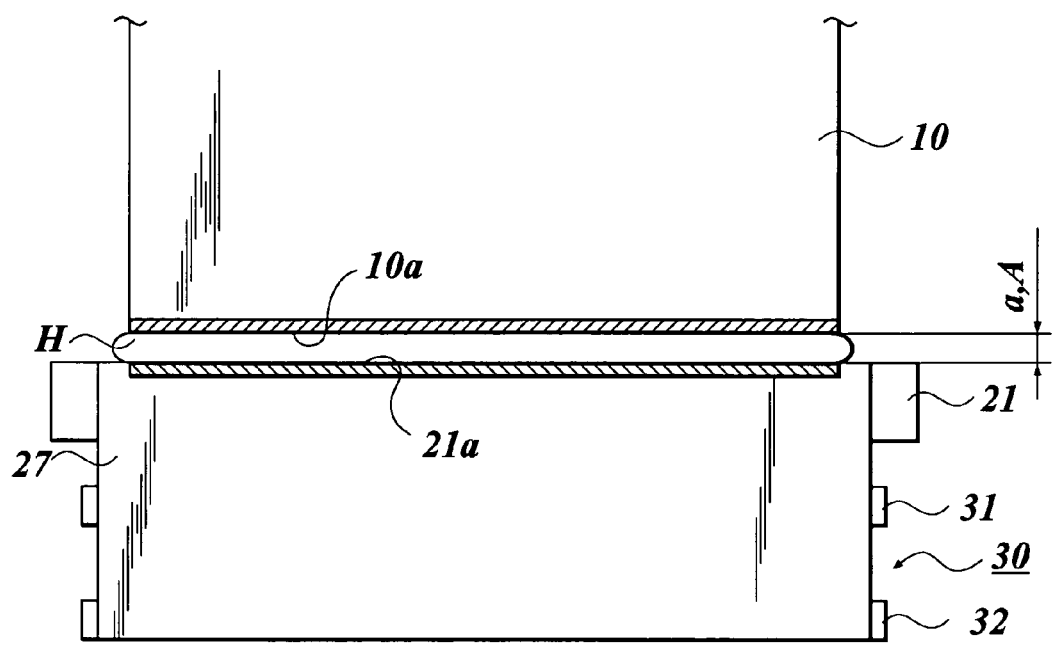
FIG. 4 is a front view showing the thin film forming unit of FIG. 3.
Figure 5:
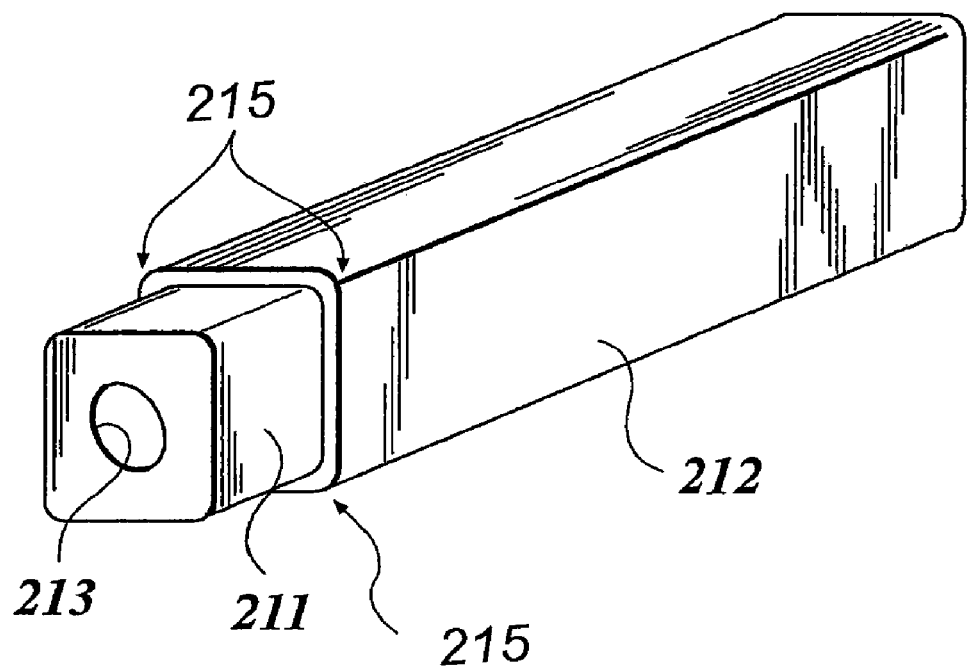
FIG. 5 is a perspective view showing a small electrode provided in the thin film forming unit of FIG. 3.

FIG. 3 is a side view of the thin film forming unit 20, and FIG. 4 is a front view of the thin film forming unit 20. In the thin film forming unit 20, a couple of small electrodes (a second electrode) 21, each opposed to the peripheral surface of the first electrode 10 and having a width larger than the width of the first electrode 10, is disposed with a space a between. That is, one of the couple of small electrodes 21 is a first small electrode 21A, and the other small electrode 21 is a second small electrode 21B adjoining to the first small electrode 21A. The above-mentioned space a is a discharge space A, and opposed surfaces of the first electrode 10 and the small electrodes 21, all constituting the discharge space A, will be referred to as discharge surfaces 10a and 21a, respectively. Moreover, a gap b is formed between the couple of small electrodes 21. FIG. 5 is a perspective view showing the small electrode 21. The small electrode 21 is a rod electrode made by coating a dielectric 212 on the surface of an electrically-conductive metallic base material 211. The inside of the small electrode 21 is hollow. A temperature control unit 6 is connected to the hollow portion 213 through a pipe arrangement 5. By flowing a temperature controlling medium in the hollow portion 213, the temperature control of the electrode surface can be performed. Moreover, corner parts (connecting corner parts) 215 of the small electrode 21 are severally shaped in an arc. That is, four surfaces of the small electrode 21 are continuous with the corner parts 215 between, and consequently the discharge surface 10a and the surfaces other than the discharge surface 10a are continuous. Furthermore, a second power source 23 is connected to the small electrodes 21 of each of the thin film forming units 20 through a second filter 22, as shown in FIG. 1.

Moreover, as shown in FIG. 3, a gas supply unit 24 for jetting gas toward the gap b of the couple of small electrodes 21 is disposed to be opposed to the gap b in each of the thin film forming units 20. Consequently, the gap b works as a flow path B for supplying the gas to the discharge space A. The gas supply unit 24 includes a nozzle body unit 25 in which a gas flow path is formed, and a gas jetion unit 26 for jetting the gas, which protrudes from the nozzle body unit 25 toward the flow path B and communicates with the gas flow path.

Moreover, each of the thin film forming units 20 includes a film transporting mechanism 30 correspondingly to each of the small electrodes 21 for transporting a protecting film 27 continuously or intermittently to prevent the small electrode 21 from being contaminated while the protecting film 27 is contacting the small electrode 21. The film transporting mechanisms 30 is provided with a first film guide roller 31 for guiding the protecting film 27 near the gas supply unit 24. On the upper stream side of the first film guide roller 31, a not shown unwinding roller of the protecting film 27 or an original winding of the protecting film 27 is provided.

Moreover, at a position farther than the position of the first film guide roller 31 from the gas supply unit 24, a winding roller 33 (see FIG. 6) for winding the protecting film 27 through a second film guide roller 32 is provided. All of the overall widths of the first film guide roller 31, the second film guide roller 32 and the protecting film 27 are, as shown in FIG. 4, set to be wider than the overall width of the first electrode 10. To put it concretely, the length of the overall width of the protecting film 27 is preferably set in order that both the ends of the protecting film 23 may protrude from both the ends of the first electrode 10 within a range from 1 mm through 100 mm. Consequently, the size of the protecting film 27 becomes larger than that of the discharge space A. That is, the small electrode 21 is covered by the protecting film 27, and thereby the small electrode 21 is not exposed to discharge plasma. Consequently, the small electrode 21 can be prevented from being contaminated. Moreover, because the edges of the protecting film 27 do not enter the discharge space A, arc discharges owing to the concentration of discharges can be prevented.

After the protecting film 27 has been pulled out from the unwinding roller by the film transporting mechanisms 30, the protecting film 27 is guided by the first film guide roller 31 to be contacted with the circumference of the nozzle body unit 25 of the gas supply unit 24. After that, the protecting film 27 contacts a surface 21b of the small electrode 21 constituting the flow path B, and then the protecting film 27 contacts the discharge surface 21a through the corner parts 215. After that, the protecting film 27 is guided by the second film guide roller 32 to be rolled up by the winding roller 33. Because the corner parts 215 are severally shaped in an arc, it is prevented that the protecting film 27 is hitched while moving from the surface 21b other than the discharge surface 21a to the discharge surface 21a, and then the protecting film 27 can be transported smoothly. Incidentally, in the present embodiment, the discharge surfaces 21a of the small electrodes 21 are severally a flat surface, but the discharge surfaces 21a may be severally formed to be a curved surface convex toward the discharge surfaces 10a of the first electrode 10. In this case, the contact between the discharge surfaces 21a of the small electrodes 21 and the protecting films 27 can be further heightened. Moreover, in the present embodiment, the surfaces of the small electrodes 21 constituting the flow paths B are severally also a flat surface, but the surfaces may be severally formed to be a curved surface concave toward the centers of the flow paths B. Thereby, the protecting films 27 can be also smoothly transported in the flow paths B in contact with the small electrodes 21, and the generation of wrinkles or stretches can be suppressed.

Then, as mentioned above, because the protecting films 27 are contacted with the nozzle body unit 25, the space from the gas supply unit 24 to the flow path B is partitioned by the protecting films 27, and thereby the gas is prevented from flowing to the outside of the flow path B.

Now, when the protecting films 27 do not contact the small electrodes 21, the surfaces of the small electrodes 21 work as the discharge surfaces 21a, as described above. However, when the protecting films 27 contact the small electrodes 21, the surfaces of the protecting films 27 contacting the discharge surfaces 21a work as the discharge surfaces. Similarly, when the substrate 2 does not contact the surface of the first electrode 10, the surface of the first electrode 10 works as the discharge surfaces 10a, as described above. However, when the substrate 2 contacts the surface of the first electrode 10, the surface of the substrate 2 contacting the surfaces of the discharge surfaces 10a works as the discharge surfaces. Consequently, when the substrate 2 and the protecting films 27 respectively contact the first electrode 10 and the small electrodes 21, the discharge spaces A are formed of the surfaces of the substrate 2 and the protecting films 27.

Figure 6:
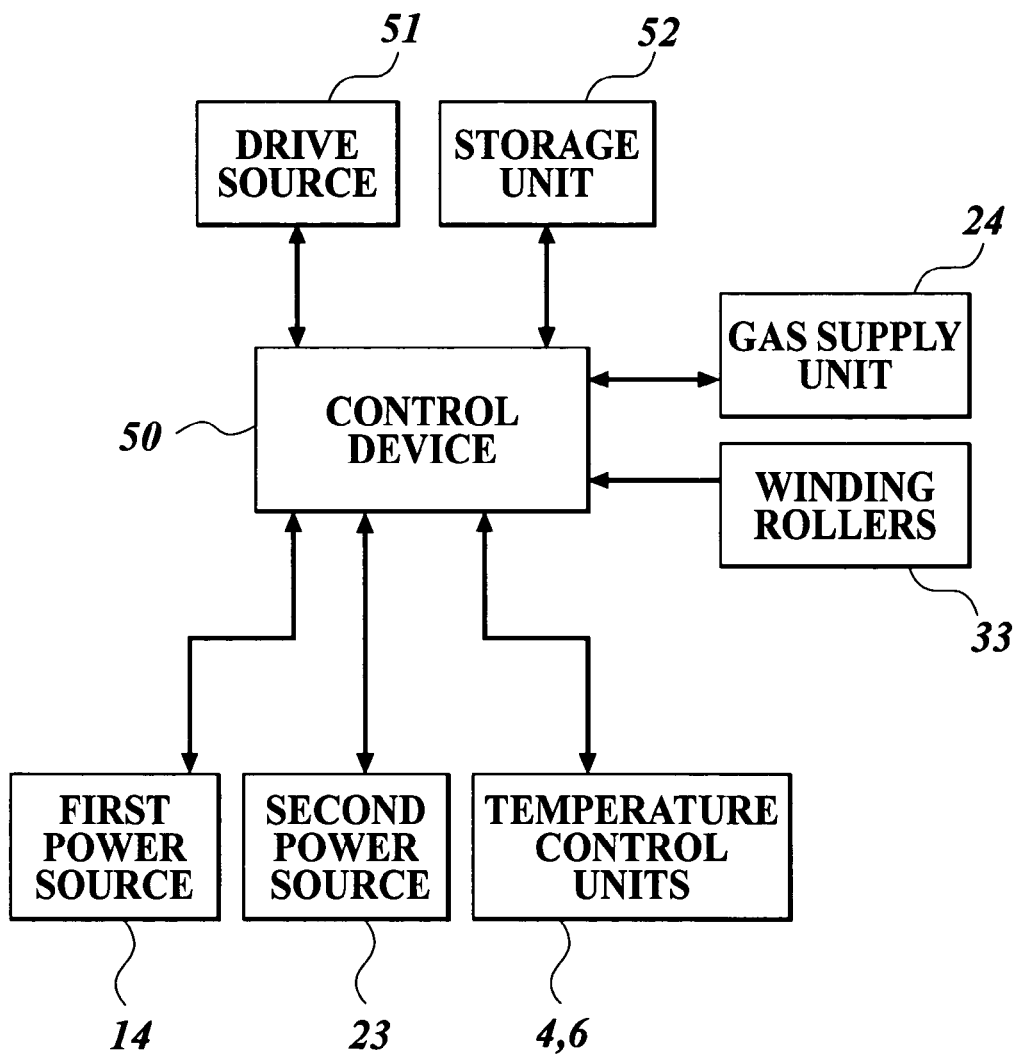
FIG. 6 is a block diagram showing a main control part of the thin film forming apparatus of FIG. 1.

The thin film forming apparatus 1 is, as shown in FIG. 6, provided with a control device 50 for controlling each drive unit. The control device 50 is electrically connected to the drive source 51, a storage unit 52, the first power source 14, the second power source 23, the gas supply unit 24, the temperature control units 4 and 6, and the winding roller 33. Incidentally, the control device 50 is also connected to each drive unit of the thin film forming apparatus 1 and the like besides the above-mentioned elements. Then, the control device 50 controls various kinds of equipment in accordance with a control program and control data, both written in the storage unit 52.

Next, the gas to be supplied to the discharge spaces A will be described.

The gas to be supplied to the discharge spaces A includes at least discharge gas and thin film formation gas. The discharge gas and the thin film formation gas may be jeted in their mixed state, or may be separately jeted. Incidentally, added gas may be added in addition to the above-mentioned gas. In any cases, the amount of the discharge gas is preferably within a range from 90 volume percent through 99.99 volume percent of the total gas amount to be supplied to the discharge spaces A.

The discharge gas means gas capable of causing a glow discharge by which a thin film can be formed. As the discharge gas, nitrogen gas, rare gas, air, hydrogen gas, oxygen gas and the like can be used. These gas may be individually used as the discharge gas, or may be mixedly used. In the present embodiment, the nitrogen gas, which is comparatively inexpensive, is used. In this case, the volume of the nitrogen may be preferably within a range from 50 volume percent through 100 volume percent of the discharge gas, and more preferably the rare gas is included by an amount less than 50 volume percent of the discharge gas as gas mixed with the nitrogen.

As the thin film formation gas, for example, organometallic compound gas, metal halide compound gas, metallic hydrogen compound gas, and the like can be cited.

As the organometallic compound, the compounds expressed by the following general formula (I) are preferable.

$$R1xMR2yR3z \qquad \text{General Formula (I)}$$

In the general formula (I), M designates a metal; R1 designates an alkyl group; R2 designates an alkoxy group; and R3 designates a group selected from the group consisting of a β-diketone complex group, a β-ketocarboxylate complex group, a β-ketocarboxylic acid component group and a ketooxy group (ketooxy component group). When the valence of the metal M is supposed to be m, x+y+z=m, where x is 0 through m, or x is 0 through m−1; y is 0 through m; and z is 0 through m, where any of x, y and z are 0 or a positive integer. As the alkyl group R1, for example, a methyl group, an ethyl group, a propyl group, a butyl group and the like can be cited. As the alkoxy group R2, for example, a methoxy group, an ethoxy group, a propoxy group, a butoxy group, a 3,3,3-trifluoropropoxy group and the like can be cited. Moreover, a compound obtained by substituting hydrogen atoms of an alkyl group for fluorine atoms maybe used. As the group R3 to be selected from the group consisting of the β-diketone complex group, the β-ketocarboxylate complex group, the β-ketocarboxylic acid component group and the ketooxy group (ketooxy component group), as the β-diketone complex group, for example, 2,4-pentanedione (also called as acetylacetone or acetoacetone), 1,1,1,5,5,5-hexamethyl-2,4-pentanedione, 2,2,6,6-tetramethyl-3,5-heptanedione, 1,1,1-trifluoro-2,4-pentanedione and the like can be cited. As the β-ketocarboxylate complex group, for example, methyl acetoacetate ester, ethyl acetoacetate ester, propyl acetoacetate ester, trimethyl ethyl acetoacetate, trifluoro methyl acetoacetate and the like can be cited. As the β-ketocarboxylic acid, for example, acetoacetic acid, triethyl acetoacetic acid and the like can be cited. Moreover, as the ketooxy, for example, an acetooxy group (or an acetoxy group), a propionyloxy group, a butyryloxy group, an acryloyloxy group, a methacryloyloxy group and the like can be cited. The numbers of the carbon atoms of these groups are preferably equal to 18 or less, inclusive of the above-mentioned organometallic compounds. Moreover, as exemplified above, straight-chain compounds, branch compounds, or compounds made by substituting hydrogen atoms for fluorine atoms may be used.

In the present invention, from the point of view of handling, the organometallic compounds which have little dangerousness of explosion are preferable. Namely, the organometallic compounds having at least one oxygen in a molecule are preferable. As such organometallic compounds, the organometallic compound having at least one alkoxy group R2 is preferable. Alternatively, the organometallic compound including at least one group R3 selected from the group consisting of the β-diketone complex group, the β-ketocarboxylate complex group, the β-ketocarboxylic acid component group and the ketooxy group (the ketooxy component group) is preferable.

Moreover, as the metals of the organometallic compounds, the metal halide compounds and the metallic hydrogen compounds to be used as the thin film formation gas, for example, Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, Lu and the like can be cited.

Moreover, in case of mixing added gas, as the added gas, for example, oxygen gas, ozone gas, hydrogen peroxide gas, carbon dioxide gas, carbon monoxide gas, hydrogen gas, ammonia gas and the like can be cited. Above all, the oxygen gas, the carbon monoxide gas and the hydrogen gas are preferable. Constituents selected among them are preferable to be mixed. The content of them is preferably within a range from 0.01 volume percent through 5 volume percent to the whole amount of the gas. Owing to the addition of them, reactions are promoted, and a fine and good quality thin film can be formed.

Next, the substrate 2 will be described. As the substrate 2, there are no particular limitations as long as a substrate capable of forming a thin film on its surface, such as a substrate having a laminar shape, a sheeted shape or a film-like flat surface shape, or having a solid shape such as a molded material including a lens and the like. The form and the quality of material of the substrate 2 are not limited as long as the substrate 2 is exposed to mixed gas in a plasma state and a uniform thin film is formed on the substrate 2 even in a still standing state or a transferring state of the substrate 2. As the quality of the material of the substrate 2, various materials such as glass, resin, earthenware, metal and nonmetal can be used. To put it concretely, as the glass, for example, a glass plate, a lens and the like can be cited. As the resin, for example, a resin lens, a resin film, a resin sheet, a resin plate and the like can be cited.

Because the resin film can be continuously transferred between the electrodes or in the vicinities of the electrodes of the thin film forming apparatus 1 according to the present invention to form a transparent conductive film, the thin film forming apparatus 1 does not adopt batch type production such as sputtering using a vacuum pressure system, and is suitable for mass production. Consequently, the thin film forming apparatus 1 is suitable for applying a continuous high productive production method.

As the quality of material of the substrate 2 made of a resin, for example, cellulose ester such as cellulose triacetate, cellulose diacetate, cellulose acetate propionate and cellulose acetate butyrate; polyester such as polyethylene terephthalate and polyethylene naphthalate; polyolefin such as polyethylene and polypropylene; polyvinylidene chloride; polyvinyl chloride; polyvinyl alcohol; ethylene vinyl alcohol copolymer; syndiotactic polystyrene; polycarbonate; norbornene resin; polymethylpentene; polyether-ketone; polyimide; polyether sulfone; polysulfone; polyether-imide; polyamide; fluororesin; polymethyl acrylate; acrylate copolymer and the like can be cited.

Moreover, in the present invention, the substrate 2 having a thickness within a range from 10 μm through 1000 μm, more preferably a range from 40 μm thorough 200 μm, and having a shape of a film is used.

Next, the protecting films 27 will be described.

The protecting films 27 are severally formed of, for example, a resin film, paper, cloth, nonwoven fabric or the like. As the resin, for example, cellulose ester such as cellulose triacetate, cellulose diacetate, cellulose acetate propionate and cellulose acetate butyrate; polyester such as polyethylene terephthalate and polyethylene naphthalate; polyolefin such as polyethylene and polypropylene; polyvinylidene chloride; polyvinyl chloride; polyvinyl alcohol; ethylene vinyl alcohol copolymer; syndiotactic polystyrene; polycarbonate; norbornene resin; polymethylpentene; polyether-ketone; polyimide; polyether sulfone; polysulfone; polyether-imide; polyamide; fluororesin; polymethyl acrylate; acrylate copolymer and the like can be cited. Then, the polyester, which is inexpensive and superior in productivity, in particular, polyethylene terephthalate (PET) and a resin film mainly composed of the PET, are further preferable.

Moreover, in the present invention, the protecting films 27 each having a thickness within a range from 10 μm through 1000 μm, more preferably having a thickness within a range from 20 μm through 100 μm, and shaped in a film is used. Furthermore, as a property required for the quality of material, a heat-resisting property, or thermal size stability, is required to be superior, because a temperature rises to a very high temperature during atmospheric pressure plasma processing. For improving the thermal size stability furthermore, the protecting films 27 are preferably processed by anneal processing or the like.

Next, the metallic base materials 11 and 211 and the dielectrics 12 and 212 constituting the first electrode 10 and the small electrodes 21, respectively, will be described.

As combinations of the metallic base materials 11 and 211 and the dielectrics 12 and 212, the combinations of ones having matched characteristics to each other is preferable. One of the preferable combination of the characteristics is a combination of the metallic base materials 11 and 211 and the dielectrics 12 and 212 having coefficients of linear thermal expansion in order that the differences between their coefficients is $10 \times 10^{-6}/°$ C. or less. The difference is preferably $8 \times 10^{-6}/°$ C. or less, more preferably $5 \times 10^{-6}/°$ C. or less, further more preferably $2 \times 10^{-6}/°$ C. or less. Incidentally, the coefficient of linear thermal expansion is a well known physical property value peculiar to a material.

For example, the following combinations can be cited as combinations of electrically-conductive metallic body materials and dielectrics having the differences of the coefficients of linear thermal expansion within the above-mentioned ranges.

1) a combination of a metallic body material of pure titanium or a titanium alloy, and a dielectric of flame spray coating of a ceramic 2) a combination of a metallic body material of pure titanium or a titanium alloy, and a dielectric of a glass lining 3) a combination of a metallic body material of stainless steel, and a dielectric of flame spray coating of a ceramic 4) a combination of a metallic body material of stainless steel, and a dielectric of a glass lining 5) a combination of a metallic body material of a composite material of a ceramic and iron, and a dielectric of flame spray coating of a ceramic 6) a combination of a metallic body material of a composite material of a ceramic and iron, and a dielectric of a glass lining 7) a combination of a metallic body material of a composite material of a ceramic and aluminium, and a dielectric of flame spray coating of a ceramic 8) a combination of a metallic body material of a composite material of a ceramic and aluminium, and a dielectrics of a glass lining From the viewpoint of the coefficient of linear thermal expansion, the above combinations 1), 2) and 5) through 8) are preferable, and especially the combination 1) is preferable.

Then, the metallic base materials 11 and 211 made from titanium or a titanium alloy are especially useful. When the metallic base materials 11 and 211 are made from titanium or a titanium alloy and the dielectrics 12 and 212 are made from a material according to one of the above-mentioned combinations, it becomes possible to withstand long time usage under a severe condition without any deterioration of using electrodes, especially their cracks, their peeling, their falling off and the like.

The metallic base materials 11 and 211 of the electrodes 10 and 21 useful for the present invention are made of a titanium alloy or a titanium metal including 70 mass percent or more of titanium. In the present invention, the titanium alloy or the titanium metal including 70 mass percent or more of titanium as its content can be used without causing any problems, but the titanium alloy or the titanium metal including 80 mass percent or more of titanium is preferably. As the titanium alloy or the titanium metal useful for the present invention, a titanium alloy or a titanium metal used generally as industrial pure titanium, corrosion resisting titanium, high strength titanium and the like can be used. As the industrial pure titanium, for example, TIA, TIB, TIC, TID and the like can be cited. Any of them includes extremely small quantities of iron atoms, carbon atoms, nitrogen atoms, oxygen atoms, hydrogen atoms and the like, and includes 99 mass percent or more of titanium as contents. As the corrosion resisting titanium alloy, T15PB can be preferably used. The T15PB includes lead in addition to the above-mentioned atom contents, and the titanium content thereof is 98 weight percent or more. Moreover, as the titanium alloy, for example, T64, T325, T525, TA3 and the like including aluminium, vanadium and tin in addition to the above-mentioned atoms except lead can be preferably used. The titanium contents of these alloys are 85 weight percent or more. These titanium alloys or titanium metals have thermal expansion coefficients having a magnitude of about a half of that of stainless steel, such as AISI 316. These titanium alloys or titanium metals are matched to be combined with the dielectrics 12 and 212 provided on the titanium alloys or the titanium metals as the metallic base materials 11 and 211, and can withstand long time usage in a high temperature.

On the other hand, as for the characteristics required for the dielectrics 12 and 212, concretely, the dielectrics 12 and 212 are preferably inorganic compounds having dielectric constants within a range from 6 through 45. As such dielectrics, for example, ceramics such as alumina and silicon nitride, glass lining materials such as a silicate glass and a borate glass, and the like can be cited. Among them, the dialects 12 and 212 formed by performing the flame spray coating of a ceramic, or formed by performing glass lining are preferable. In particular, the dielectrics 12 and 212 formed by performing the flame spray coating of alumina is preferable.

Alternatively, one of specifications for withstanding large electric power is that the percentages of voids of the dielectrics 12 and 212 are 10 volume percent or less, preferably 8 volume percent or less, further preferably larger than 0 volume percent and 5 volume percent or less. Moreover, another preferable specification capable of withstanding large electric power is that the thicknesses of the dielectrics 12 and 212 are within a range from 0.5 mm through 2 mm. The variations of the film thicknesses are preferably 5% or less, more preferably 3% or less, further preferably 1% or less.

Next, the operations at the time of thin film formation by means of the thin film forming apparatus 1 of the present embodiment will be described while various conditions suitable for the thin film formation are described.

First, when thin film formation is started, the control device 50 makes each of the gas supply units 24 jet gas to supply the jeted gas to each of the discharge spaces A. At this time, the gas jeted from the gas supply units 24 passes through the flow paths B, each formed of a couple of small electrodes 21, through the spaces partitioned by the protecting films 27, and then the gas reaches discharge spaces A. Because the protecting films 27 always contact the surfaces 21b of the small electrodes 21 constituting the flow paths B, it is prevented that the surfaces 21b are contaminated by the gas passing thorough the flow paths B.

Then, when the gas has been supplied to the discharge spaces A, the control device 50 controls the drive source 51 to rotate the first guide roller 16, the second guide roller 18 and the first electrode 10 to transport the substrate 2, with the substrate 2 contacting the peripheral surface of the first electrode 10. At the same time, the control device 50 controls the winding rollers 33 to transport the protecting films 27, with the protecting films 27 contacting the surfaces of the small electrodes 21. Hereupon, it is preferable to control the rotation speed of the winding rollers 33 in order that the transportation speeds of the protecting films 27 may be within a range from 20 mm/min through 200 m/min. Hereupon, proper values of the tensions of the protecting films 27 on the small electrodes 21 vary owing to the differences of the qualities of the materials and the thicknesses of the protecting films 27. For example, when the qualities of the materials of the protecting films 27 are made to be PET and their thicknesses are made to be 38 μm, the proper values of the tensions are within a range from 25 gf/mm through 75 gf/mm. When the tensions are smaller than 25 gf/mm, the protecting films 27 lose touch with the small electrodes 21. When the tensions are larger than 75 gf/mm, the size of the thin film forming apparatus 1 becomes large, and local extensions of the protecting films 27 are actualized to generate stretches.

When the substrate 2 is transported, the control device 50 turns on the first power source 14 and the second power source 23. Thereby, a first high frequency electric field having a frequency $\omega 1$, an electric field intensity V1 and an electric current I1 from the first power source 14 is applied to the substrate 2 from the first electrode 10. On the other hand, a second high frequency electric field having a frequency $\omega 2$, an electric field intensity V2 and an electric current I2 from the second power source 23 is applied to the substrate 2 from the small electrodes 21. Hereupon, the frequency $\omega 2$ is set to be higher than the frequency $\omega 1$.

To put it concretely, the frequency $\omega 1$ is preferably equal to or less than 200 kHz, and the lower limit thereof is 1 kHz. The electric field waveform may be a continuous wave or a pulse wave. On the other hand, the frequency $\omega 2$ is preferably equal to or more than 800 kHz. The higher the frequency $\omega 2$ is, the higher the plasma density is. The upper limit of the frequency $\omega 2$ is about 200 MHz.

Moreover, the discharge gas is supplied between the electrodes. Then, when the electric field intensity between the electrodes is gradually increased, discharges start. If the electric field intensity at which the discharges start is defined as a discharge start electric field intensity IV, the relation between the electric field intensities V1 and V2 and the discharge start electric field intensity IV is set to meet the relation of $V1 \geq IV > V2$ or $V1 > IV \geq V2$. For example, in the case where the discharge gas is nitrogen, because the discharge start electric field intensity IV is about 3.7 kV/mm, the nitrogen gas can be excited to become a plasma state by applying the electric field intensity V1 meeting the relation of $V1 \geq 3.7$ kV/mm, and the electric field intensity V2 meeting the relation of $V2 < 3.7$ kV/mm in accordance with the above-mentioned relation.

Then, the relation between the electric currents I1 and I2 is preferably I1<I2. The electric current I1 of the first high frequency electric field is preferably within a range from 0.3 mA/cm$^2$ through 20 mA/cm$^2$, more preferably within a range from 1.0 mA/cm$^2$ through 20 mA/cm$^2$. Moreover, the electric current I2 of the second high frequency electric field is preferably within a range from 10 mA/cm$^2$ through 100 mA/cm$^2$, more preferably within a range from 20 mA/cm$^2$ through 100 mA/cm$^2$.

In such a way, when the first high frequency electric field owing to the first electrode 10 and the second high frequency electric fields owing to the small electrodes 21 are generated, a high frequency electric field formed by superposing the first high frequency electric field and each of the second high frequency electric fields on each other is produced in each of the discharge spaces A, and the produced high frequency electric fled acts on the gas to generate discharge plasma. Plasma spaces H in which the discharge plasma is generated protrude from the discharge surfaces 10a of the first electrode 10 and the discharge surfaces 21a of the small electrodes 21, as shown in FIGS. 3 and 4. However, the substrate 2 and the protecting films 27 respectively contact the surfaces other than the discharge surfaces 10a and 21a, which continue to the discharge surfaces 10a and 21a of the first electrode 10 and the small electrodes 21, before the substrate 2 and the protecting films 27 respectively contact the discharge surfaces 10a and 21a of the first electrode 10 and the small electrodes 21. Therefore, the substrate 2 and the protecting films 27 respectively enter the plasma spaces H in the state of being supported by the surfaces other than the discharge surfaces 10a and 21a. Thereby, even when the substrate 2 and protecting films 27 are influenced by heat, the thermal influence is averaged. Consequently, the generation of wrinkles and stretches can be prevented.

Moreover, because the surface temperatures of the first electrode 10 and the small electrodes 21 are controlled by the temperature control units 4 and 6, respectively, the substrate 2 and the protecting films 27 are previously heated by the surfaces other than the discharge surfaces 10a and 21a before the substrate 2 and the protecting films 27 enter the plasma spaces H. Consequently, even when the substrate 2 and the protecting films 27 enter the plasma spaces H, it is prevented that the substrate 2 and the protecting films 27 are thermally influenced rapidly and excessively, and the contraction owing to the heat of the discharge plasma can be suppressed. Consequently, the generation of the wrinkles and the stretches on the substrate 2 and the protecting films 27 can be further prevented. In particular, because, in the small electrodes 21, the surfaces other than the discharge surfaces 21a, against which the protecting films 27 are contacted before the protecting films 27 enter the plasma spaces H, secure predetermined areas, the protecting films 27 can be continuously heated until the protecting films 27 reach the discharge surface 21a. Consequently, the protecting films 27 are not rapidly heated at the small electrodes 21, and then the generation of the wrinkles and the stretches can be further suppressed. Incidentally, the protecting films 27 may be stepwise heated in place of being continuously heated.

Then, when the substrate 2 passes through in the plasma spaces H, a thin film is formed on the substrate 2. The physical properties and the composition of the obtained thin film sometimes vary at some temperatures of the substrate 2 during the plasma discharge processing. Therefore, it is preferable that even during the thin film formation, the surface temperature of the first electrode 10 is controlled by circulating a medium, the temperature of which is controlled by the temperature control unit 4, in the first electrode 10, and accordingly the temperature of the substrate 2 is appropriately controlled. Hereupon, the temperature control unit 4 controls the temperature of the temperature controlling medium to be a temperature within a range from 20° C. to 300° C., preferably a range from 80° C. to 100° C., in order that the controlled temperature may become one at which the substrate 2 can exhibit its predetermined properties. On the other hand, the temperature control unit 6 also controls the temperature of the temperature controlling medium to be within a range from 20° C. through 300° C., preferably within a range from 80° C. through 100° C. Incidentally, the temperature control units 4 and 6 should control the temperature of the medium in order that the temperature may not fall below a vaporization condition temperature of the gas to be used as the lower limit temperature.

Then, the substrate 2 on which the thin film has been formed is transported up to the next process through the second guide roller 18.

As described above, according to the thin film forming apparatus 1 of the present embodiment, the film transporting mechanisms 30 make the protecting films 27 contact the surfaces 21b other than the discharge surface 21a, which continue to the discharge surfaces 21a of the small electrodes 21. After that, the film transporting mechanisms 30 transport the protecting films 27 with the protecting films 27 contacting the discharge surfaces 21a of the small electrodes 21. Consequently, the surfaces of the small electrodes 21 are covered by the contacting protecting films 27. Hence, it is prevented that the discharge surfaces 21a of the small electrodes 21 are contaminated by the activated gas. Moreover, because the protecting films 27 are transported by the film transporting mechanisms 30, the protecting films 27 contacting the discharge surfaces 21a of the small electrodes 21 can be continuously exchanged for new ones.

Moreover, because each of the film transporting mechanisms 30 is provided to each of the small electrodes 21, the protecting films 27 are transported at every small electrode 21, and then the contamination of each of the small electrodes 21 can be severally prevented.

Then, because the protecting films 27 contact the discharge surfaces 21a of the small electrodes 21 and the surfaces other than the discharge surfaces 21a, the small electrodes 21 can be protected when the film formation gas is not made to flow and only the discharge gas is made to flow in the discharge spaces A.

Then, because the substrate transporting mechanism 15 transports the substrate 2 while making the substrate 2 contact the discharge surfaces 10a of the first electrode 10, it can be prevented that the discharge surfaces 10a of the first electrode 10 are contaminated by the activated gas. Moreover, before the substrate 2 contacts the discharge surfaces 10a of the first electrode 10, the substrate transporting mechanism 15 makes the substrate 2 contact the surfaces other than the discharge surfaces 10a of the first electrode 10, which continue to the discharge surfaces 10a. Therefore, the substrate 2 enters the plasma spaces H in the state of being supported by the surfaces other than the discharge surfaces 10a. Thereby, even when substrate 2 is thermally influenced, the influence is averaged. Consequently, the generation of wrinkles and stretches can be prevented, and a high quality thin film can be formed.

Moreover, because the film formation can be performed under the atmospheric pressure or a pressure near to the atmospheric pressure, a high speed film formation and continuous manufacturing can be performed in comparison with the case where the film formation is performed in a vacuum pressure. Then, because devices for producing the vacuum pressure are not required, the cost of equipment can be reduced.

Incidentally, it is of course that the present invention is not limited to the above mentioned embodiment and can be modified appropriately.

Figure 7:
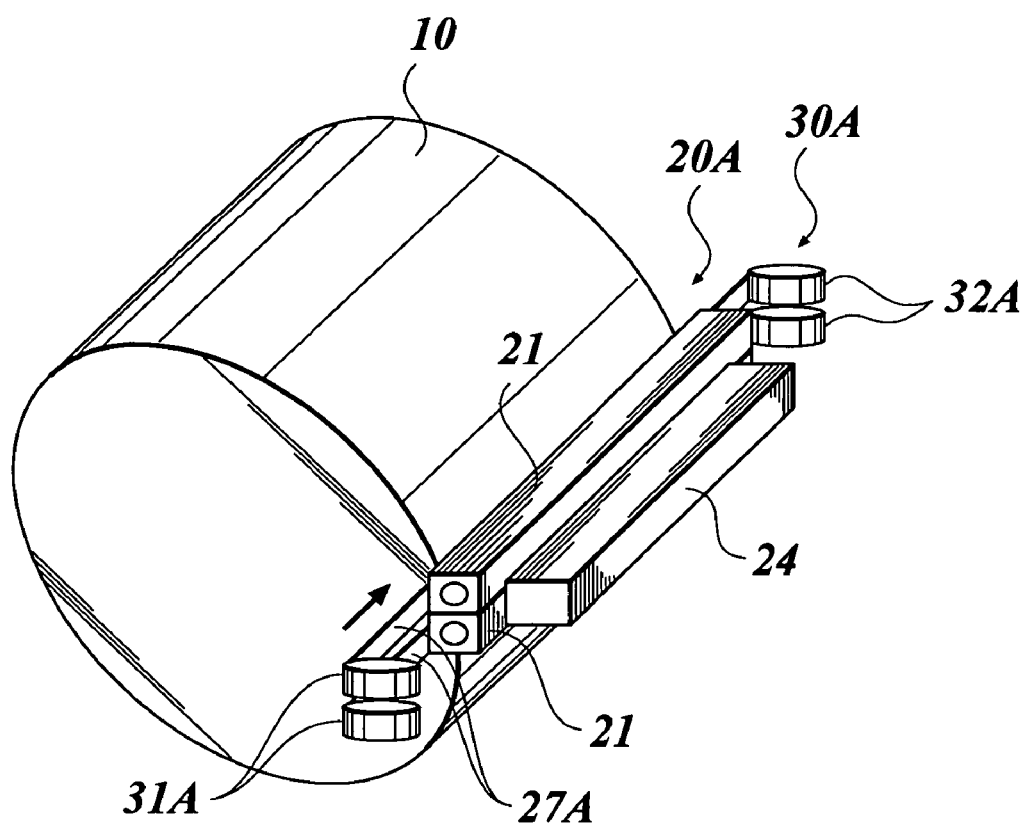
FIG. 7 is a perspective view showing a modification of the thin film forming apparatus.
Figure 8:
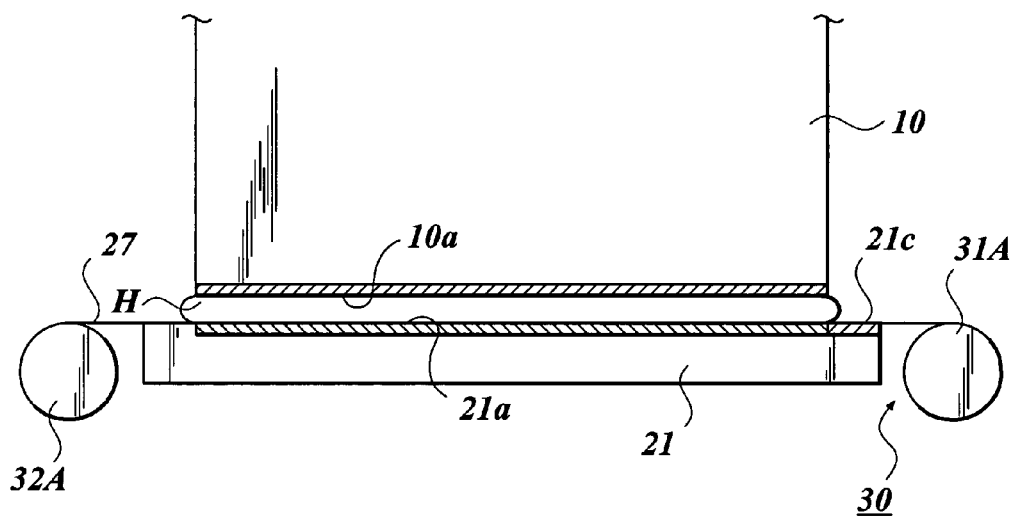
FIG. 8 is a front view showing a thin film forming unit provided in the thin film forming apparatus of FIG. 7.
Figure 9:
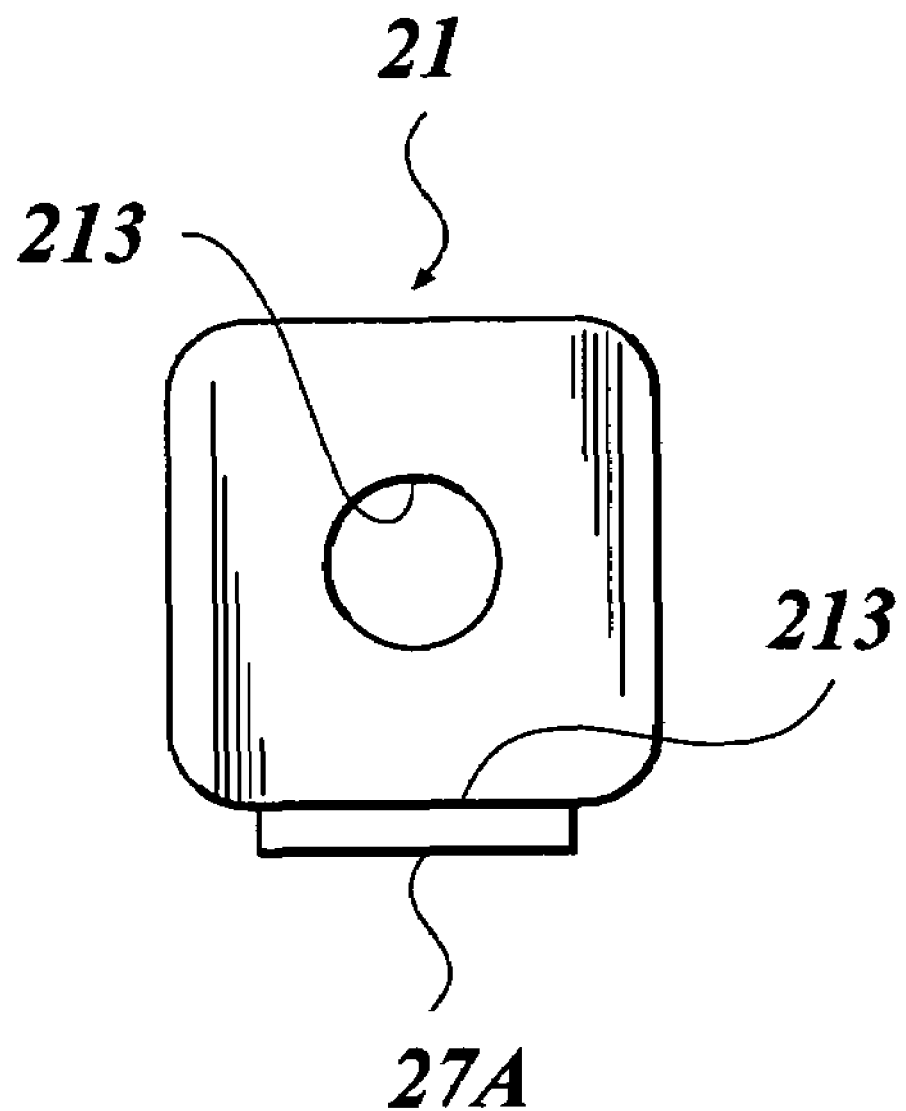
FIG. 9 is a side view showing a contact state of a protecting film with a small electrode in the thin film forming apparatus of FIG. 7.

For example, in the present embodiment, the case where the protecting films 27 are transported into the directions perpendicular to the axial directions of the small electrodes 21 in contact with the discharge surfaces 21a of the small electrodes 21 is exemplified to be described. However, the protecting films 27 may be transported into any directions, as long as the protecting films 27 are transported in contact with the discharge surfaces 21a from the surfaces other than the discharge surfaces 21a of the small electrodes 21, which continue to the discharge surface 21a. For example, a case where protecting films 27A are transported along the axial directions of the small electrodes 21 can be cited. In the following, FIGS. 7-9 will be referred to while the case where the protecting films 27A are transported along the axial directions of the small electrodes 21 is concretely described. FIG. 7 is a perspective view showing the schematic configuration of a thin film forming apparatus 1A. FIG. 8 is a front view showing a thin film forming unit 20A in the thin film forming apparatus 1A. Moreover, FIG. 9 is a side view showing a contact state of a protecting film 27A with one of the small electrodes 21 in the thin film forming apparatus 1A. Incidentally, the same constituent elements as those of the above-mentioned embodiment are designated by the same reference numerals as those of the above-mentioned embodiment, and the descriptions of them are omitted.

The thin film forming unit 20A in the thin film forming apparatus 1A is, as shown in FIGS. 7 and 8, provided with a film transporting mechanism 30A correspondingly to each of the small electrodes 21 for making the protecting films 27A contact the small electrodes 21 while transporting the protecting films 27A continuously or intermittently along the axial directions of the small electrodes 21. The widths of the protecting films 27A to be transported by the film transporting mechanisms 30A are, as shown in FIG. 9, set according to the widths of the discharge surfaces 21a in the directions perpendicular to the axial directions of the small electrodes 21. Then, each of the film transporting mechanisms 30A is, as shown in FIG. 8, provided with a first film guide roller 31A for rotatably holding one of the protecting films 27A wound into a roller on one side of one of the small electrodes 21. Moreover, on the other side of the small electrode 21, a second film guide roller 32A for winding the protecting film 27A around the roller 32A is provided. By means of the film transporting mechanisms 30A, the protecting films 27A are pulled out from the first film guide rollers 31A, and contact surfaces 21c other than the discharge surfaces of the small electrodes 21, which continue to the discharge surfaces 21a. After that, the protecting films 27 contact the discharge surfaces 21a, and then are wound around the second film guide rollers 32A. Thereby, the protecting films 27A enter the plasma spaces H in the state of being supported by the surfaces 21c other than the discharge surfaces 21a of the small electrodes 21. Consequently, even if the protecting films 27A are thermally influenced, the influence is averaged. Hence, the generation of wrinkles and stretches can be prevented.

Moreover, in the above-mentioned embodiments, the small electrodes 21 work as heating equipments in the present invention for heating the protecting films 27. However, anything which can heat the protecting films 27 on the upper stream sides in the transportation directions of the protecting films 27 with respect to the discharge surfaces 21a of the small electrodes 21 can be used. For example, disposing members dedicated for heating on the upper stream sides in the transportation directions of the protecting films 27 with respect to the discharge surfaces 21a of the small electrodes 21 can be cited besides the small electrodes 21 of the embodiments.

Moreover, in the above-mentioned embodiments, each of the small electrodes 21 is formed in a shape of almost a prism and is fixed. However, the small electrodes may be roller electrodes mounted rotatably. In such a case, because the small electrodes themselves rotate according to the transportation of the protecting films 27, the transportation of the protecting films 27 can be performed smoothly. Moreover, the configuration in which the small electrodes themselves rotate for driving the protecting films 27 would be able to perform the transportation of the protecting films 27 efficiently.

Furthermore, if a gas supply unit comprises a plurality of jet ports, the thin film formation gas can be prevented from flowing to the outside of the flow path. Hereinafter, the case where the gas supply unit comprises the plurality of jet ports will be described. The same portions as those of the above-mentioned thin film forming apparatus 1 are designated by the same reference numerals as those of the above-mentioned the thin film forming apparatus 1, and the descriptions of them are omitted.

Figure 10:
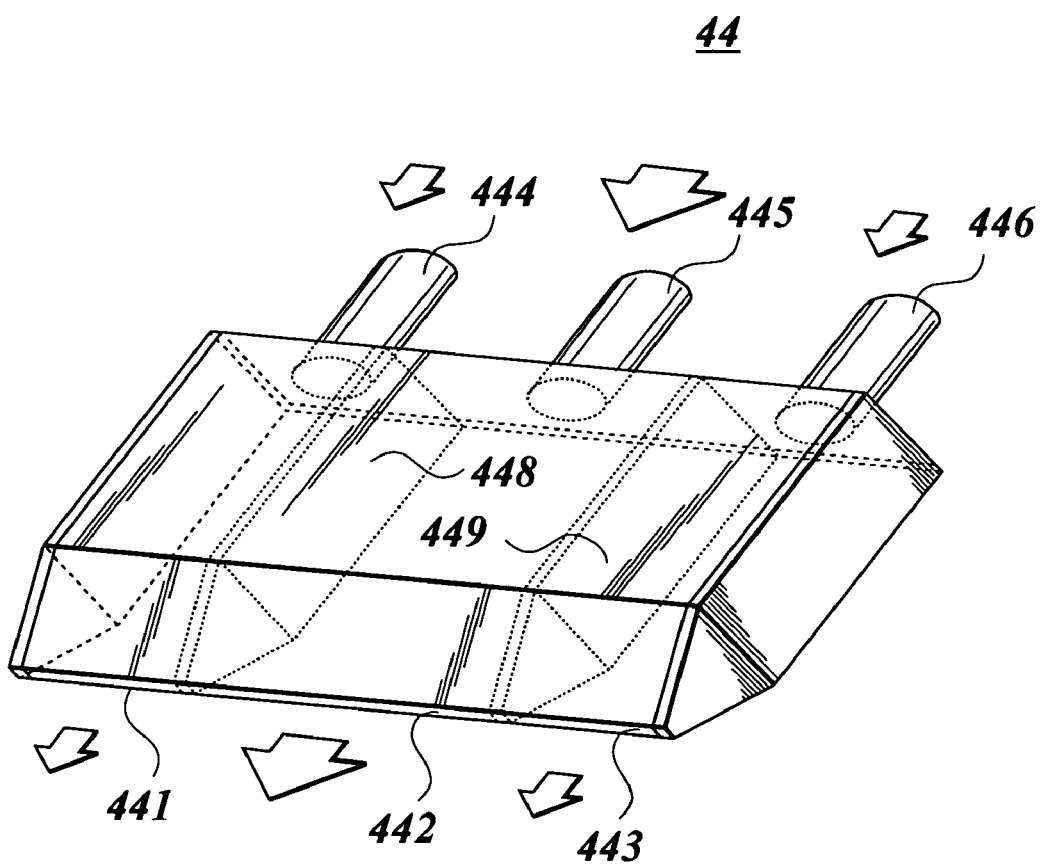
FIG. 10 is a perspective view showing a gas supply unit comprising a plurality of jet ports.

FIG. 10 is a perspective view showing the gas supply unit comprising the plurality of jet ports. As shown in the FIG. 10, at the fore-end of a gas supply unit 44, the plurality of jet ports 441, 442 and 443 for jetting each gas are arranged in line. That is, when the gas supply unit 44 is placed to be opposed to the gap b, these jet ports 441, 442 and 443 are arranged along an axial direction of the small electrode 21 to face the gap b.

A plurality of gas pipes 444, 445 and 446 are connected to the back-end of the gas supply unit 44. Then, a plurality of gas tanks (not shown) for storing gas different respectively are connected to these gas pipes 444, 445 and 446, through gas adjusting units (not shown) for adjusting flow volumes, flow velocities, gas compositions, concentrations and the like of the gas flowing inside gas pipes 444, 445 and 446. The gas adjusting unit adjusts the gas flowing from the plurality of gas tanks, severally or by mixing the gases each other, based on the control by the control device 50. After that, the gas adjusting unit further adjusts the flow volumes, the flow velocities or the like to send the gases to each of gas pipes 444, 445 and 446, respectively.

Then, the source gas including the materials for the thin film forming is stored in at least one of the gas tanks among these plurality of gas tanks. Further, the gas without thin film formation gas not including the materials is stored in at least one of the gas tanks. Then, in the case where the source gas includes the discharge gas, if the source gas is supplied into the discharge space A through the flow path B in the state that an electric field is applied to the first electrode 10 and the small electrodes 21. However, in the case where the source gas doesn't include the discharge gas, a gas tank for storing the discharge gas must be provided. In this case, although the source gas and the discharge gas is supplied serve severally into the discharge space A through the flow path B, the source gas and the discharge gas are mixed in the discharge space A. Therefore, if the electric filed is applied to the first electrode 10 and the small electrodes 21, discharge plasma is generated, and the materials can be activated.

Hereupon, the source gas and the gas without thin film formation gas will be described.

The source gas is mixed gas including at least the discharge gas and thin film formation gas. Incidentally, the source gas may further include added gas in addition to above-mentioned gas. In any cases, the discharge gas amount is preferably within a range from 90 volume percent through 99.99 volume percent of the total gas amount to be supplied to the discharge spaces A.

As the gas without thin film formation gas, the gas not including chemical compounds included in the thin film formation gas to be the materials of the thin film is used. To put it concretely, above-mentioned discharge gas, oxygen, carbon monoxide, air or the like can be cited. In the case where the discharge gas is used as the gas without thin film formation gas, the discharge plasma generated in the discharge space A can be averaged.

Furthermore, inside the gas supply unit 44, divider plates 448 and 449 are provided in order to prevent the gas supplied from each of gas pipes 444, 445 and 446 from being mixed each other before the gas reaches the gas jet ports 441, 442 and 443.

Figure 11:
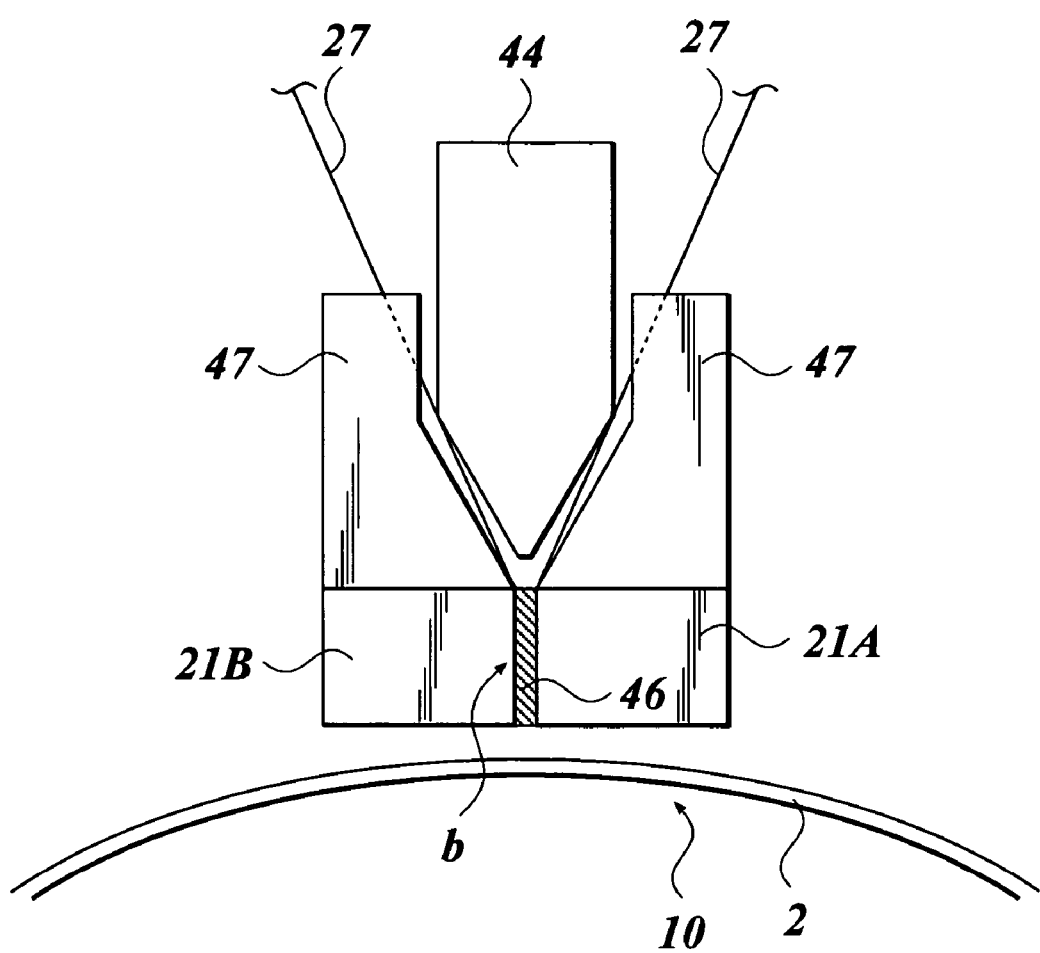
FIG. 11 is a side view showing the gas supply unit of FIG. 10 and a couple of small electrodes.

FIG. 11 is a side view showing the couple of small electrodes 21A and 21B and the gas supply unit 44. As shown in FIG. 11, at both end portions of the gap b between the couple of small electrodes 21A and 21B, filling materials 46 contacting the couple of small electrodes 21A and 21B are provided respectively, so as to fill the gap b. The filling material 46 has heat resistance capable of withstanding the temperature during the generation of the discharge plasma, and is formed of the isolative material. Further, the filling material 46 is placed in the area not covering the discharge surfaces 21a of the couple of small electrodes 21A and 21B.

Figure 12:
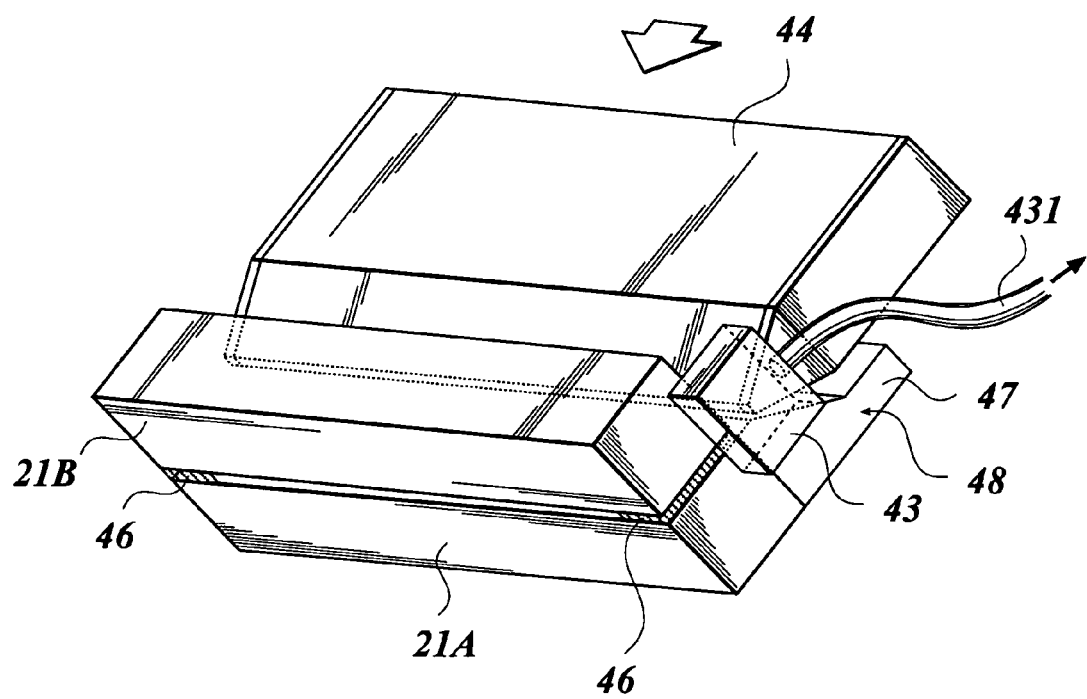
FIG. 12 is a perspective view showing the gas supply unit of FIG. 10 and a gas suction unit.
Figure 13:
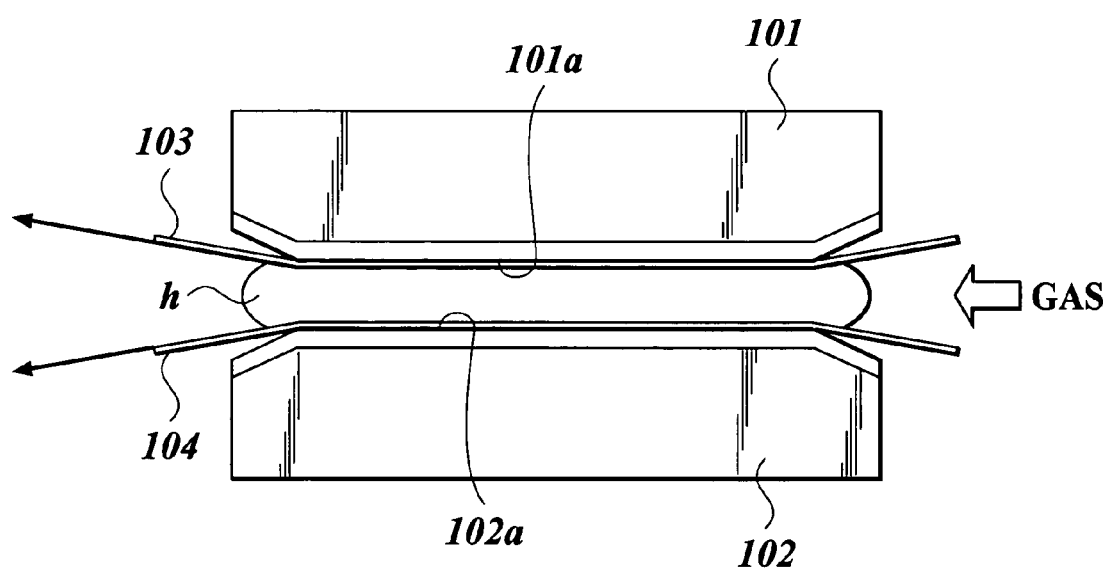
FIG. 13 is an explanation drawing showing a contact state between electrodes and a substrate at conventional thin film formation.

Furthermore, as shown in FIG. 11, at both end portion of the couple of small electrodes 21A and 21B, gas bulkheads 47 for preventing the gas from flowing out are provided in order that they sandwich the protecting film 27. Then, on both sides of the couple of small electrodes 21A and 21B, gas suction units 48 for sucking the gas flowing out form the flow path are provided respectively. Incidentally, if at least one of the gas suction units 48 is provided on at least one of the sides of the couple of small electrodes 21A and 21B, the effect for preventing the gas from flowing out can be obtained FIG. 12 is a perspective view showing the gas supply unit 48. Incidentally, in FIG. 12, the gas bulkhead 47 with respect to the small electrode 21A, and the gas suction unit 48 to be placed on the other side of the couple of small electrodes 21A and 21B are not shown.

The gas suction unit 48 comprises a suction port unit 43 for sucking the gas and suction pump (not shown) being connected to the suction port unit 43 through a suction pipe 431. The suction pump is controlled by the control device 50. Furthermore, the suction port unit 43 may have any shape as long as it has the suction port for sucking the gas.

Next, the operations of the gas suction unit 48 and the gas supply unit 44 will be described.

First, the control device 50 activates the suction pump in accordance with the start of the thin film formation. On this occasion, the control device 50 sets a suction condition so that the suction pump can suck the gas effectively during the suction, and controls the suction pump based on the suction condition. Hereupon, the suction condition denotes suction flow volume, suction flow velocity, ambient pressure or the like. Preferably, the suction condition is set as the values capable of performing of the stable thin film formation even during the suction. These values have been obtained experiments, simulations or the like.

Then, the control device 50 makes the gas supply unit jet the gas therefrom to supply the gas into the discharge space A. Hereupon, the control device 50 sets the jet conditions of each of the jet ports 441, 442 and 443 so as to reduce the amount of the source gas flowing out from the gap b as much as possible, and controls the gas adjusting unit according to the jet conditions. To put it concretely, the jet conditions of the jet ports 441 and 443 which are placed on both the end portions of the gas supply unit 44 are set so as to jet the gas without thin film formation gas. Furthermore, the jet condition of the jet port 442 other than these jet ports 441 and 443 which are placed on both the end portions of the gas supply unit 44 is set so as to jet the source gas. Accordingly, when the gas is supplied from the gas supply unit 44 into the discharge space A, the source gas is blocked from outside air by the gas without thin film formation gas, and consequently, the source gas can be prevented from flowing out from the gap b.

Then, the gas jetted from the gas supply unit 44 flows to the flow path B formed by the couple of small electrodes 21A and 21B through a space divided by the protecting film 27. On this occasion, even if the gas flows from the flow path B, because most of the gas is the gas without thin film formation gas, the influence on the inside of the apparatus is slight. Further, even if the source gas is included in the flowing-out gas, because the gas suction unit 48 sucks the flowing-out gas, the inside of the apparatus can be prevented from contamination.

As mentioned above, because the jet conditions can be set with respect to the plurality of jet ports 441, 442 and 443 respectively, each of the jet conditions can be set so as to make the gas including materials for the thin film formation be hard to flow out from the flow path or the discharge space A. Herewith, the gas can be prevented from flowing out, and the contamination of the inside of the apparatus can be suppressed.

Furthermore, because on both sides of the small electrodes 21A and 21B, the gas suction units 48 are provided respectively, the gas flowing out from the side of the small electrodes 21A and 21B can be sucked by the gas suction unit 48. Hence, the contamination of the inside of the apparatus can be suppressed.

Incidentally, in the above-mentioned embodiments, a direct plasma method, which forms the thin film on the substrate 2 by getting the substrate 2 through the plasma space H formed between the first electrode 10 and the small electrode 21A, is exemplified to be described. However, a remote plasma method can be also applied. As the remote plasma method, the following method, which is described, for example, in JP-Tokukaihei-05-23579A or JP-Tokukai-2003-49272A, can be cited. That is, by applying an electric field while mixed gas is jetted between a couple of opposed electrodes, discharge plasma is jetted from between the electrodes, and then, a film is formed by exposing a substrate, which is placed so as to face the electrodes, to the discharge plasma. In this case, the present art can be applied to the discharge surface of the above-mentioned electrode.

EXAMPLES

[Electrode]

The first electrode 10 was an electrode shaped in a roller having a diameter of 1000 mm and made from titanium alloy T64. The small electrodes 21 were electrodes each having a shape of almost a prism of 40 mm×40 mm and made from the titanium alloy T64. On each of the surfaces of the opposed first electrode 10 and the small electrodes 21, a flame spray coating of alumina having a high density and high contact was performed by an atmospheric plasma method. After that, a liquid solution produced by diluting tetramethoxysilane with ethyl acetate was coated on the alumina to be dried. Moreover, the coatings were cured by ultraviolet irradiation and sealing processing was performed. After that, the coated dielectric surfaces were abraded to be smooth. Thus, the dielectric surfaces were worked out to have $R_{max}$ of 5 μm.

Hereupon, in each of the small electrodes 21, the dielectric was coated in order that the curvatures of the surfaces forming the flow path B and the discharge surface 21a might be within a range from R 20 mm through R 2000 mm, and the curvatures of the continuous corner parts 215 might be within a range from R 1 mm through R 20 mm. Incidentally, a preferable range of the curvatures of the continuous corner parts 215 is one from R 3 mm through R 8 mm. In each of the concrete small electrodes 21 of the present example, the dielectric was coated in order that the curvatures of the surface constituting the flow path B and the discharge surface 21a might be R 500 mm and the curvatures of the continuous corner parts 215 might be R 5 mm.

[Thin Film Forming Apparatus]

The thin film forming apparatus 1 of the above-mentioned embodiment was used. The first electrode 10 and the small electrodes 21 produced as mentioned above were disposed in order that the spaces a between them might be 1 mm. Hereupon, the composition of the gas was composed of 97.9 volume percent of a discharge gas (nitrogen), 0.1 volume percent of thin film formation gas (tetraisopropoxy titanium), and 2.0 volume percent of an added gas (hydrogen). Moreover, as the substrate 2, Konica Tack KC8UX was used. As the protecting films 27, PET films made by Mitsubishi Polyester Film Corporation or made by Teijin DuPont Films Japan Limited were used. Then, film formation was made under the following conditions: the discharge start electric field intensity IV was 3.7 kV/mm; the frequency ω1 of the first high frequency electric field of the first electrode 10 was 5 kHz; the electric field intensity V1 was 12 kV/mm; the frequency ω2 of the second high frequency electric field of each of the small electrodes 21 was 800 kHz; and the electric field intensity V2 was 1.2 kV/mm.

As a comparative example, the thin film forming apparatus exemplified as the prior art was used to perform thin film formation using the same substrate and the same gas used in the example.

After a plurality of times of thin film formation was repeated, the thin films formed in both of the example and the comparative example were compared to each other. The thin films of the example were formed to be uniform to the substrates. On the other hand, as for the comparative example, stretches and wrinkles were generated on the substrates, and the thin films were also not uniform.

The entire disclosure of Japanese Patent Application No. Tokugan 2003-95367 filed on Mar. 31, 2003, No. Tokugan 2003-195845 filed on Jul. 11, 2003 and No. Tokugan 2003-201172 filed on Jul. 24, 2003 including specification, claims, drawings and summary are incorporated herein by reference in its entirety.

What is claimed is:

1. A thin film forming apparatus comprising:
a first electrode having a first discharge surface and a second electrode having a second discharge surface, the first discharge surface facing opposite to the second discharge surface to form a discharge space;
a gas supply unit for supplying a gas including a thin film formation gas to the discharge space;
a power source for discharging and activating the gas by applying a high frequency electric field across the discharge space; and
a film transporting mechanism for transporting a protecting film for preventing the first electrode or the second electrode from being exposed to the activated gas,
wherein a thin film is formed by exposing a substrate to the activated gas and,
the protecting film is transported in contact with the first discharge surface and a surface, which is a part of the first electrode and continues to the first discharge surface, or with the second discharge surface and a surface which is a part of the second electrode and continues to the second discharge surface.

2. The thin film forming apparatus of claim 1, wherein the film transporting mechanism transports the protecting film in contact with the discharge surface of the second electrode and with the surface, which is a part of the second electrode and continues to the second discharge surface.

3. The thin film forming apparatus of claim 1, wherein the first electrode and the second electrode generate the high frequency electric field in the discharge space under an atmospheric pressure or a pressure near to the atmospheric pressure.

4. The thin film forming apparatus of claim 2, wherein a heating equipment for heating the protecting film is provided on an upper stream side in a transportation direction of the protecting film with respect to the discharge surface of the second electrode.

5. The thin film forming apparatus of claim 4, wherein the heating equipment heats the protecting film stepwise or continuously until the protecting film reaches the discharge surface.

6. The thin film forming apparatus of claim 2, further comprising a substrate transporting mechanism for transporting the substrate in contact with the discharge surface of the first electrode.

7. The thin film forming apparatus of claim 6, wherein the substrate transporting mechanism transports the substrate in a state in which the substrate contacts the first discharge surface of the first electrode, after the substrate transporting mechanism makes the substrate contact, which is a part of the first electrode and continues to the first discharge surface of the first electrode.

8. The thin film forming apparatus of claim 2, wherein a continuous corner part between the discharge surface of the second electrode and the surface, which is a part of the second electrode and is other than the second discharge surface, is shaped in an arc.

9. The thin film forming apparatus of claim 2, wherein the discharge surface of the second electrode is formed to be a curved surface convex toward the discharge surface of the first electrode.

10. The thin film forming apparatus of claim 2,
wherein the second electrode is formed of a plurality of small electrodes; and
the film transporting mechanism is provided to each of the small electrodes.

11. The thin film forming apparatus of claim 10,
wherein the small electrodes are fixed; and
the film transporting mechanisms transport the protecting films while rubbing the protecting films against the surfaces of the small electrodes.

12. The thin film forming apparatus of claim 10,
wherein the gas supply unit is disposed so as to supply the gas to the discharge space through a flow path formed as an interval between a first small electrode among the plurality of the small electrodes and a second small electrode adjoining to the first small electrode; and
the film transporting mechanisms of each of the first small electrode and the second small electrode transports the protecting films, in contact with a surface of one of the small electrodes forming the flow path.

13. The thin film forming apparatus of claim 12, wherein each of the surfaces of the small electrodes forming the flow path is formed to be a curved surface convex toward a center of the flow path.

14. The thin film forming apparatus of claim 12, wherein the film transporting mechanism of each of the first small electrode and the second small electrode transports the protecting film to the surface of the small electrode forming the flow path, after the film transporting mechanism contacts the protecting film with at least a part of the gas supply unit.

15. The thin film forming apparatus of claim 1,
wherein the high frequency electric field is formed by superposing a first high frequency electric field by the first electrode and the second high frequency electric field by the second electrode;
a frequency $\omega 2$ of the second high frequency electric field is higher than a frequency $\omega 1$ of the first high frequency electric field; and
a relation among an electric field intensity $V1$ of the first high frequency electric field, an electric field intensity $V2$ of the second high frequency electric field and a discharge start electric field intensity $IV$ satisfies an inequality $V1 \geqq IV > V2$ or an inequality $V1 > IV \geqq V2$.

16. The thin film forming apparatus of claim 1, wherein the protecting film is made from polyester.

17. The thin film forming apparatus of claim 1, wherein a width of the protecting film is set to be wider than the discharge space.

* * * * *

UNITED STATES PATENT AND TRADEMARK OFFICE
CERTIFICATE OF CORRECTION

PATENT NO. : 7,647,887 B2  Page 1 of 1
APPLICATION NO. : 10/807774
DATED : January 19, 2010
INVENTOR(S) : Maeda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1463 days.

Signed and Sealed this

Sixteenth Day of November, 2010

David J. Kappos
*Director of the United States Patent and Trademark Office*